(12) United States Patent
Han et al.

(10) Patent No.: US 9,831,247 B2
(45) Date of Patent: *Nov. 28, 2017

(54) MEMORY DEVICE COMPRISING ELECTRICALLY FLOATING BODY TRANSISTOR

(71) Applicant: Zeno Semiconductor, Inc., Sunnyvale, CA (US)

(72) Inventors: Jin-Woo Han, San Jose, CA (US); Yuniarto Widjaja, San Jose, CA (US)

(73) Assignee: Zeno Semiconductor Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/218,287

(22) Filed: Jul. 25, 2016

(65) Prior Publication Data

US 2016/0336326 A1    Nov. 17, 2016

Related U.S. Application Data

(60) Continuation of application No. 14/685,827, filed on Apr. 14, 2015, now Pat. No. 9,431,401, which is a division of application No. 14/203,235, filed on Mar. 10, 2014, now Pat. No. 9,029,922.

(60) Provisional application No. 61/775,521, filed on Mar. 9, 2013, provisional application No. 61/816,153, filed on Apr. 25, 2013.

(51) Int. Cl.
| | | |
|---|---|---|
| *H01L 29/00* | (2006.01) |
| *H01L 27/108* | (2006.01) |
| *H01L 29/78* | (2006.01) |
| *G11C 16/00* | (2006.01) |
| *G11C 16/04* | (2006.01) |
| *H01L 29/06* | (2006.01) |
| *G11C 11/404* | (2006.01) |
| *G11C 11/407* | (2006.01) |

(52) U.S. Cl.
CPC ...... *H01L 27/10802* (2013.01); *G11C 11/404* (2013.01); *G11C 11/407* (2013.01); *G11C 16/00* (2013.01); *G11C 16/0416* (2013.01); *H01L 29/0649* (2013.01); *H01L 29/7841* (2013.01)

(58) Field of Classification Search
CPC .................. H01L 29/7841; H01L 27/10802
See application file for complete search history.

(56) References Cited

U.S. PATENT DOCUMENTS

| | | |
|---|---|---|
| 4,300,212 A | 11/1981 | Simko |
| 4,385,308 A | 5/1983 | Uchida |
| 4,959,812 A | 9/1990 | Momodoni et al. |
| 5,519,831 A | 5/1996 | Holzhammer |
| 5,581,504 A | 12/1996 | Chang et al. |
| 5,748,538 A | 5/1998 | Lee et al. |

(Continued)

OTHER PUBLICATIONS

Pulcani et al., "Simulation of intrinsic bipolar transistor mechanisms for future capacitor-less eDRAM on bulk substrate", Electronics, Circuits and Systems (ICECS), 2010 17th IEEE International Conference on . . . , IEEE, 2010, pp. 966-969.

(Continued)

*Primary Examiner* — Ngan Ngo
(74) *Attorney, Agent, or Firm* — Law Office of Alan W. Cannon

(57) ABSTRACT

A semiconductor memory cell comprising an electrically floating body. A method of operating the memory cell is provided.

14 Claims, 34 Drawing Sheets

(56) References Cited

U.S. PATENT DOCUMENTS

| | | | |
|---|---|---|---|
| 5,767,549 A | 6/1998 | Chen et al. | |
| 5,999,444 A | 12/1999 | Fujiwara et al. | |
| 6,005,818 A | 12/1999 | Ferrant et al. | |
| 6,064,100 A | 5/2000 | Wen | |
| 6,141,248 A | 10/2000 | Forbes et al. | |
| 6,163,048 A | 12/2000 | Hirose et al. | |
| 6,166,407 A | 12/2000 | Ohta | |
| 6,243,293 B1 | 6/2001 | Van Houdt et al. | |
| 6,341,087 B1 | 1/2002 | Kunikiyo et al. | |
| 6,356,485 B1 | 3/2002 | Proebsting et al. | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,625,057 B2 | 9/2003 | Iwata | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,845,042 B2 | 1/2005 | Ichige et al. | |
| 6,870,751 B2 | 3/2005 | van Brocklin et al. | |
| 6,885,581 B2 | 4/2005 | Nemati et al. | |
| 6,912,150 B2 | 6/2005 | Portman et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,085,156 B2 | 8/2006 | Ferrant et al. | |
| 7,118,986 B2 | 10/2006 | Steigerwalt et al. | |
| 7,170,807 B2 | 1/2007 | Fazan et al. | |
| 7,209,384 B1 | 4/2007 | Kim | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,280,399 B2 | 10/2007 | Fazan et al. | |
| 7,285,820 B2 | 10/2007 | Park et al. | |
| 7,301,803 B2 | 11/2007 | Okhonin et al. | |
| 7,301,838 B2 | 11/2007 | Waller et al. | |
| 7,329,580 B2 | 2/2008 | Cho et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,498,630 B2 | 3/2009 | Ichige et al. | |
| 7,504,302 B2 | 3/2009 | Matthew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,701,763 B2 | 4/2010 | Roohparvar | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,847,338 B2 | 12/2010 | Widjaja | |
| 7,933,139 B2 | 4/2011 | Lung | |
| 7,933,140 B2 | 4/2011 | Wang et al. | |
| 8,014,200 B2 | 9/2011 | Widjaja | |
| 8,036,033 B2 | 10/2011 | Widjaja | |
| 8,059,459 B2 | 11/2011 | Widjaja | |
| 8,077,536 B2 | 12/2011 | Widjaja | |
| 8,116,130 B1 * | 2/2012 | Ratnakumar | G11C 17/16 365/148 |
| 8,130,547 B2 | 3/2012 | Widjaja et al. | |
| 8,130,548 B2 | 3/2012 | Widjaja et al. | |
| 8,159,868 B2 | 4/2012 | Widjaja | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,194,471 B2 | 6/2012 | Widjaja et al. | |
| 8,208,302 B2 | 6/2012 | Widjaja | |
| 8,243,499 B2 | 8/2012 | Widjaja | |
| 8,264,875 B2 | 9/2012 | Widjaja et al. | |
| 8,264,876 B2 | 9/2012 | Widjaja et al. | |
| 8,294,193 B2 | 10/2012 | Widjaja | |
| 8,298,875 B1 | 10/2012 | Or-Bach et al. | |
| 8,391,066 B2 | 3/2013 | Widjaja | |
| 8,472,249 B2 | 6/2013 | Widjaja | |
| 8,514,622 B2 | 8/2013 | Widjaja | |
| 8,514,623 B2 | 8/2013 | Widjaja et al. | |
| 8,531,881 B2 | 9/2013 | Widjaja | |
| 8,559,257 B2 | 10/2013 | Widjaja | |
| 8,570,803 B2 | 10/2013 | Widjaja | |
| 8,582,359 B2 | 11/2013 | Widjaja | |
| 8,654,583 B2 | 2/2014 | Widjaja | |
| 8,711,622 B2 | 4/2014 | Widjaja | |
| 8,767,458 B2 | 7/2014 | Widjaja | |
| 8,837,247 B2 | 9/2014 | Widjaja | |
| 8,923,052 B2 | 12/2014 | Widjaja | |
| 8,934,296 B2 | 1/2015 | Widjaja | |
| 8,937,834 B2 | 1/2015 | Widjaja et al. | |
| 8,957,458 B2 | 2/2015 | Widjaja | |
| 8,995,186 B2 | 3/2015 | Widjaja | |
| 9,001,581 B2 | 4/2015 | Widjaja | |
| 9,025,358 B2 | 5/2015 | Widjaja | |
| 9,029,922 B2 * | 5/2015 | Han | G11C 16/0416 257/288 |
| 9,030,872 B2 | 5/2015 | Widjaja et al. | |
| 9,087,580 B2 | 7/2015 | Widjaja | |
| 9,153,309 B2 | 10/2015 | Widjaja et al. | |
| 9,153,333 B2 | 10/2015 | Widjaja | |
| 9,208,840 B2 | 12/2015 | Widjaja et al. | |
| 9,208,880 B2 | 12/2015 | Louie et al. | |
| 9,209,188 B2 | 12/2015 | Widjaja | |
| 9,230,651 B2 | 1/2016 | Widjaja et al. | |
| 9,230,965 B2 | 1/2016 | Widjaja | |
| 9,236,382 B2 | 1/2016 | Widjaja et al. | |
| 9,257,179 B2 | 2/2016 | Widjaja | |
| 9,391,079 B2 | 7/2016 | Widjaja | |
| 9,401,206 B2 | 7/2016 | Widjaja | |
| 9,431,401 B2 * | 8/2016 | Han | G11C 16/0416 |
| 9,460,790 B2 | 10/2016 | Widjaja | |
| 2002/0018366 A1 | 2/2002 | von Schwerin et al. | |
| 2002/0048193 A1 | 4/2002 | Tanikawa et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0018164 A1 | 1/2006 | Wu | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0263466 A1 | 11/2007 | Morishita et al. | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0111154 A1 | 5/2008 | Voldman | |
| 2008/0123418 A1 | 5/2008 | Widjaja | |
| 2008/0185646 A1 * | 8/2008 | Anderson | H01L 27/108 257/347 |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |

(56) References Cited

U.S. PATENT DOCUMENTS

| | | |
|---|---|---|
| 2010/0046287 A1 | 2/2010 | Widjaja |
| 2010/0157664 A1 | 6/2010 | Chung |
| 2010/0246277 A1* | 9/2010 | Widjaja ............... G11C 11/404 |
| | | 365/189.04 |
| 2010/0246284 A1 | 9/2010 | Widjaja et al. |
| 2010/0290271 A1 | 11/2010 | Lung |
| 2011/0032756 A1 | 2/2011 | Widjaja |
| 2011/0042736 A1 | 2/2011 | Widjaja |
| 2011/0044110 A1 | 2/2011 | Widjaja |
| 2011/0170329 A1 | 7/2011 | Kang |
| 2011/0228591 A1 | 9/2011 | Widjaja |
| 2011/0228617 A1 | 9/2011 | Wang et al. |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081976 A1 | 4/2012 | Widjaja et al. |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2012/0241708 A1 | 9/2012 | Widjaja |
| 2012/0281475 A1 | 11/2012 | Oh et al. |
| 2013/0015517 A1 | 1/2013 | Widjaja et al. |
| 2013/0058169 A1 | 3/2013 | Lee et al. |
| 2013/0094280 A1 | 4/2013 | Widjaja |
| 2013/0229857 A1 | 9/2013 | Kajigaya |
| 2013/0250685 A1 | 9/2013 | Widjaja |
| 2013/0264656 A1 | 10/2013 | Widjaja et al. |
| 2014/0036577 A1 | 2/2014 | Widjaja |
| 2014/0159156 A1 | 6/2014 | Widjaja |
| 2014/0160868 A1 | 6/2014 | Widjaja et al. |
| 2014/0198551 A1* | 7/2014 | Louie ..................... G11C 15/04 |
| | | 365/49.1 |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0300613 A1 | 10/2016 | Widjaja |
| 2016/0300841 A1 | 10/2016 | Widjaja |
| 2017/0092648 A1* | 3/2017 | Widjaja ............ H01L 27/10802 |

OTHER PUBLICATIONS

Rodriguez et al., "A-RAM memofy cell: concept and operation", Electron Device Letters, IEEE, vol. 31, No. 9 (2010), pp. 972-974.

Rodriguez et al., "A-RAM Novel capacitor-less DRAM memory", Intl SOI Conference, 2009 IEEE International . . . , pp. 1-2, IEEE, 2009.

Zhang et al., "Total ionizing Dose Effects on FinFET-Based Capacitor-less 1T-DRAMs", Nuclear Science, IEEE Trnasactions on . . . , vol. 57, No. 6, 2010, pp. 3298-3304.

Villaret et al., "Mechanisms of charge modulation in the floating body of triple-well nMOSFET capacitor-less DRAMs", Microelectronic Engineering 72 (2004) 434-439.

Almeida et al., "Comparison between low and high read bias in FB-RAM on UTBOX FDSOI devices", IEEE, 1978-1-4673-0192-3/12, 2012, pp. 61-64.

Andrade et al., "The impact of Back Bias on the Floating Body Effect in UTBOX SOI Devices for 1T-FBRAM Memory Applications", 2012 8th International Caribbean Conferences on Devices, Circuits and Systems (ICCDCS), IEEE, 2012, 978-1-4577-1117-6/12/$26.00.

Aoulaiche et al., "Hot Hole Induced Damage in 1T-FBRAM on Bulk FinFET", 978-1-4244-911-7/11/$26.00. IEEE, 2011, pp. 2D.3.1-2D.3.6.

Aoulaiche et al., "Junction Field Effect on the Retention Time for One-Transistor Floating-Body RAM", IEEE Transactions on Electron Devices, vol. 59, No. 8, Aug. 2012, pp. 2167-2172.

Avci et al., "Floating-Body Diode—A Novel DRAM Device", IEEE Electron Device Letters, vol. 33, No. 2, Feb. 2012, pp. 161-163.

Cao et al., "A Novel 1T-DRAM Cell for Embedded Application", IEEE Transactions on Electron Devices, vol. 59, No. 5, May 2012, pp. 1304-1310.

Cho et al., "Variation-Aware Study of BJT-based Capacitorless DRAM Cell Scaling Limit", Silicon Nanoelectronics Workshop (SNW), 2012 IEEE; 978-1-4673-0996-7.

Cho et al., "Variation Study and Implications for BJT-BasedThin-Body Capacitorless DRAM", IEEE Electron Device Letters, vol. 33, No. 3, Mar. 2012, pp. 312-314.

Chun et al., "A 667 MHz Logic-Compatible Embedded DRAM Featuring an Asymmetric 2T Gain Cell for High Speed On-Die Caches", IEEE Journal of Solid-State Circuits, vol. 47, No. 2, Feb. 2012, pp. 547-559.

Collaert et al., "Substrate bias dependency of sense margin and retention in bulk FinFET 1T-DRAM cells", Solid-State Electronics 65-66 (2011) 205-210.

Galeti et al., "BJT effect analysis in p- and n-SOI MuGFETs with high-k gate dielectrics and TiN metal gate electrode for a 1T-DRAM application", 978-1-61284-760-3/11/$26.00 © 2011 IEEE.

Gamiz et al., "3D Trigate 1T-DRAM memory cell for 2x nm nodes", 978-1-4673-1081-9/12/$31.00 © 2012 IEEE.

Gamiz et al., "A 20nm Low-Power Triple-Gate Multibody 1T-DRAM cell", 978-1-4577-2084-0/12/$26.00 © 2012 IEEE.

Hwang et al., "Offset Buried Metal Gate Vertical Floating Body Memory Technology with Excellent Retention Time for DRAM Application", 2011 Symposium on VLSI Technology Digest of Technical Papers, pp. 172-173.

Kim et al., "Optical Charge-Pumping: A Universal Trap Characterization Technique for Nanoscale Floating Body Devices", 2011 Symposium on VLSI Technology Digest of Technical Papers, pp. 190-191.

Lee et al., "A Novel Capacitorless 1T DRAM Cell for Data Retention Time Improvement", IEEE Transactions on Nanotechnology, vol. 10, No. 3, May 2011; pp. 462-466.

Liu et al., "A three-dimensional DRAM using floating body cell in FDSOI devices", 978-1-4673-1188-5/12/$31.00 © 2012 IEEE.

Lu et al., "A Floating-Body/Gate DRAM Cell Upgraded for Long Retention Time", IEEE Electron Device Letters, vol. 32, No. 6, Jun. 2011, pp. 731-733.

Mahatme et al., "Total Ionizing Dose Effects on Ultra Thin Buried Oxide Floating Body Memories", 978-1-4577-1680-5/12/$26.00 © 2012 IEEE; pp. MY.3.1-MY.3.5.

Moon et al., "Multi-Functional Universal Device using a Band-Engineered Vertical Structure", 978-1-4577-0505-2/11/$26.00 © 2011 IEEE, pp. 24.6.1-24.6.4.

Nicoletti et al., "The Dependence of Retention Time on Gate Length in UTBOX FBRAM With Different Source/Drain Junction Engineering", IEEE Electron Device Letters, vol. 33, No. 7, Jul. 2012, pp. 940-942.

Pulicani et al., "Simulation of Intrinsic Bipolar Transistor Mechanisms for future capacitor-less eDRAM on bulk substrate." 978-1-4244-8157-6/10/$26.00 2010 IEEE pp. 966-969.

Rodriguez et al., "A-RAM: Novel capacitor-less DRAM memory", 978-1-4244-5232-3/09/$25.00 © 2009 IEEE.

Rodriguez et al., "A-RAM Memory Cell: Concept and Operation", IEEE Electron Device Letters, vol. 31, No. 3, Sep. 2010, pp. 972-974.

(56) References Cited

OTHER PUBLICATIONS

Rodriguez et al., "Novel Capacitorless 1T-DRAM Cell for 22-nm Node Compatible With Bulk and SOI Substrates", IEEE Transactions on Electron Devices, vol. 58, No. 8, Aug. 2011, pp. 2371-2377.

Romanjek et al., "Compact (Wg/Lg)=80/85 nm FDSOI 1T-DRAM programmed by Meta Stable Dip", 978-1-4673-0192-3/12/$31.00 © 2012 IEEE, pp. 199-202.

Rothemund et al., "The importance of being modular", 584 | Nature | vol. 485 | May 31, 2012, pp. 584-585.

Shim et al., "A BJT-Based Heterostructure 1T-DRAM for Low-Voltage Operation", IEEE Electron Device Letters, vol. 33, No. 1, Jan. 2012, pp. 14-16.

Shin et al., "A Novel Double HBT-Based Capacitorless 1T DRAM Cell With Si/SiGe Heterojunctions", IEEE Electron Device Letters, vol. 32, No. 7, Jul. 2011, pp. 850-852.

Shin et al., "Vertical-Gate Si/SiGe Double-HBT-Based Capacitorless 1T DRAM Cell for Extended Retention Time at Low Latch Voltage", IEEE Electron Device Letters, vol. 33, No. 2, Feb. 2012, pp. 134-136.

Ventrice et al., "Analytical model of deeply-scaled thyristors for memory applications", Microelectronics and Electron Devices (WMED), 2012 IEEE Workshop on, 978-1-4577-1735-2, pp. 1-4.

Wu et al., "Experimental Demonstration of the High-Performance Floating-Body/Gate DRAM Cell for Embedded Memories", IEEE Electron Device Letters, vol. 33, No. 6, Jun. 2012, pp. 743-745.

Zhang et al., "Total Ionizing Dose Effects on FinFET-Based Capacitor-Less 1T-DRAMs", IEEE Transactions on Nuclear Science, vol. 57, No. 6, Dec. 2010, pp. 3298-3304.

Pelizzer et al., "A 90nm Phase Change Memory Technology for Stand-Alone Non-Volatile Memory Applications", 2006 Symposium on VLSI Technology Digest of Technical Papers, 1-4244-0005-8/06/$20.00 (c) 2006 IEEE.

Reisch, "On bistable behavior and open-base breakdown of bipolar transistors in the avalanche regime-modeling and applications." Electron Devices, IEEE Transactions on 39.6 (1992): 1398-1409.

Sakui et al., "A new static memory cell based on reverse bias current (RBC) effect of bipolar transistor", Electron Devices Meeting, 1988. IEDM'88. Technical Digest, International IEEE, 1988, pp. 44-47.

Sakui et al., "A new static memory cell based on the reverse bias current effect of bipolar transistors", Electron Devices, IEEE Transactions on 36.6 (1989): 1215-1217.

Sze et al., "Physics of Semiconductor Devices", Wiley-Interscience, 2007, p. 104.

Terada et al., "A new VLSI memory cell using capacitance coupling (CC) cell", Electron Devices, IEEE Transactions on 31.9 (1984); pp. 1319-1324.

Villaret et al., "Further insight into the physics and modeling of floating-body capacitorless DRAMs", Electron Devices, IEEE Transactions on 52.11 (2005); pp. 2447-2454.

Ohsawa et al., "Autonomous refresh of floating-body cell due to Current Anomaly of Impact Ionization", vol. 56, No. 10, pp. 2301-2311, 2009.

Ban et al., "A Scaled Floating Body Cell (FBC) memory with High-k+Metal Gate on Thin-Silicon and Thin-Box fro 16-nm Technology Node and Beyond", Symposium on VLSI Technology, 2008, pp. 92-93.

Campardo et al., VLSI Design of Non-Volatile Memories, Springer-Berlin Heidelberg New York, 2005, pp. 94-95.

Han et al., "Programming/Erasing Characteristics of 45 nm NOR-Type Flash Memory Based on Soi Fin Fet Structure", J. Korean Physical Society, vol. 47, Nov. 2005, pp. S564-S567.

Headland, Hot electron injection, Feb. 19, 2004.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Lanyon et al., "Bandgap Narrowing in Moderately to Heavily Doped Silicon", pp. 1014-1018, No. 7, vol. ED-26, 1979 IEEE.

Leiss, et al, "dRAM Design Using the Taper-Isolated Dynamic RAM Cell." Solid-State Circuits, IEEE Journal of 17.2 (1982): 337-344.

Lin et al., "A new 1T DRAM Cell with enhanced Floating Body Effect", pp. 1-5, Proceedings of the 2006 IEEE International Workshop on Memory Technology.

Ohsawa et al., "Autonomous refresh of floating body cell (FBC)", Electron Devices Meeting, 2008. IEDM 2008. IEEE International. IEEE 2008, pp. 801-804.

Oh et al., "A 4-Bit Double SONOS memory (DSM) with 4 Storage Nodes Per Cell for Ultimate Multi-Bit Operation", pp. 1-2, 2006 Symposium on VLSI Technology Digest of Technical Papers.

Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.

Ban et al., "Integration of Back-Gate doping for 15-nm node floating body cell (FBC) memory", VLSI Technology (VLSIT), 2010 Symposium on IEEE, 2010, pp. 159-160.

Chiu et al., "Characteristics of a new trench-oxide thin film transistor and its 1T-DRAM applications", Solid-State and Integrated Circuit Technology (ICSICT), 2010 10th IEEE International Conference on IEEE, 2010, pp. 1106-1108.

Chiu et al., "A simple process of thin-film transistor using the trench-oxide layer for improving 1T-DRAM performance", Next Generation Electronics (ISNE), 2010 International Symposium on IEEE, 2010, pp. 254-257.

Chun et al., "A 1.1 V, 667 MHz random cycle, asymmetric 2T gain cell embedded DRAM with a 99.9 percentile retention time of 110 microsec", VLSI Circuits (VLSIC), 2010 IEEE Symposium on, IEEE, 2010, pp. 191-192.

Collaert et al., "A low voltage biasing scheme for aggressively scaled bulk FinFET 1T-DRAM featuring 10s retention at 85 C", VLSI Technology (VLSIT), 2010 Symposium on. IEEE, 2010, pp. 161-162.

Giusi et al., "Bipolar mode operation and scalability of double-gate capacitorless 1T-DRAM cells", Electron Devices, IEEE Transactions on, vol. 57, No. 8 (2010), pp 1743-1750.

Gupta et al., "32nm high-density, high-speed T-RAM embedded memory technology", Electron Devices Meeting (IEDM), 2010 IEEE International, IEEE, 2010, pp. 12.1.1-12.1.4.

Han et al., "Bistable resistor (biristor)-gateless silicon nanowire memory", VLSI Technology (VLSIT), 2010 Symposium on. IEEE, 2010, pp 171-172.

Han et al., "Biristor-bistable resistor based on a silicon nanowire", Electron Device Letters, IEEE 31.8 (2010), pp. 797-799.

Hubert et al., "Experimental comparison of programming mechanisms in 1T-DRAM cells with variable channel length", Solid-State Device Research Conference (ESSDERC), 2010 Proceedings of the European., pp. 150-153, Sep. 14-16, 2010.

Kim et al., "Vertical double gate Z-RAM technology with remarkable low voltage operation for DRAM application", VLSI Technology (VLSIT), 2010 Symposium on . . . , 2010, pp. 163-164.

Pellizer et al., "A 90 nm Phase Change Memory Technology for Stand-Alone Non-Volatile Memory Applications", Symposium on VLSI Technology Digest of Technical Papers, IEEE, 2006, pp. 1-2.

Ranica et al., "Scaled 1T-Bulk devices built with CMOS 90nm technology for low-cost eDRAM applications", 2005 Symposium on VLSI Technology Digest of Technical Papers, pp. 38-39.

Pierret, Semiconductor Device Fundamentals, ISBN: 0-201-54393-1, 1996, Addison-Wesley Publishing Company, Inc., PNPN Devices 463-476.

(56) References Cited

OTHER PUBLICATIONS

Tack et al., "The Multistable Charge-Controlled Memory Effect in SOI Transistors at Low Temperatures", IEEE Transactions on Electron Devices, vol. 37, May 1990, pp. 1373-1382.

Okhonin et al., "A SOI Capacitor-less 1T DRAM Concept", 2001 IEEE International SOI Conference, pp. 153-154.

Ohsawa et al., "An 18.5ns 128Mb SOI DRAM with a Floating Body Cell", IEEE International Solid-State Circuits Conference, 2005, pp. 458-459 and 609.

Okhonin et al., "Principles of Transient Charge Pumping on Partially Depleted SOI MOSFETs", IEEE Electron Device Letters, vol. 23, No. 5, May 2002, pp. 279-281.

Okhonin et al., "A Capacitor-less 1T DRAM Cell", IEEE Electron device Letters, vol. 23, No. 2, Feb. 2002, pp. 85-87.

Ohsawa et al., "Memory Design using One-Transistor Gain Cell on SOI", Tech. Digest, IEEE Internataional Solid-State Circuits, vol. 37, No. 11, 2002, pp. 1510-1522.

Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.

Bawedin et al., "Floating-Body SOI Memory: Concepts, Physics and Challenges", ECS Transactions 19.4 (2009) pp. 243-256.

Kim et al., "Silicon on replacement insulator (SRI) floating body cell (FBC) memory", VLSI Technology (VLSIT), 2010 Symposium on . . . , IEEE, 2010, pp. 165-166.

Kim et al., "Investigation of 1T DRAM cell with non-overlap structure and recessed channel", Silicon Nanoelectronics Workshop (SNW), 2010, IEEE, 2010, pp. 1-2.

Lu et al., "A simplified superior floating-body/gate DRAM cell", IEEE Elec. Dev. Letters, vol. 30, No. 3, Mar. 2009, pp. 282-284.

Moon et al., "fin-width dependance of BJT-based 1T-DRAM implemented on FinFET", Electron Device Letters, vol. 31, No. 9 (2010), pp. 909-911.

Moon et al., "An optically assisted program method for capacitorless 1T-DRAM", Electron Devices, IEEE Transactions on . . . , vol. 57, No. 7, 2010, pp. 1714-1718.

Moon et al., "Ultimately scaled 20nm unified-RAM", Electron Devices Meeting (IEDM), 2010 IEEE International, IEEE, 2010, pp. 12.2.1-12.2.4.

\* cited by examiner

Floating Body 24 is positively charged and V(BL 18) = 0.0V

FB is neutrally charged: and V(BL 18) = 0.0V

MEMORY DEVICE COMPRISING ELECTRICALLY FLOATING BODY TRANSISTOR

CROSS-REFERENCE

This application is a continuation of co-pending U.S. application Ser. No. 14/685,827, filed on Apr. 14, 2015, which is a divisional application of U.S. application Ser. No. 14/203,235, filed Mar. 10, 2014, now U.S. Pat. No. 9,029,922, which claims the benefit of U.S. Provisional Application No. 61/775,521, filed Mar. 9, 2013 and U.S. Provisional Application No. 61/816,153, filed Apr. 25, 2013, each of which applications are hereby incorporated herein, in their entireties, by reference thereto.

FIELD OF THE INVENTION

The present invention relates to semiconductor memory technology. More specifically, the present invention relates to a semiconductor memory device comprising of an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

DRAM based on the electrically floating body effect has been proposed, both on silicon on insulator (SOI) substrate (see for example "A Capacitor-less 1T-DRAM Cell", S. Okhonin et al., pp. 85-87, IEEE Electron Device Letters, vol. 23, no. 2, February 2002 ("Okhonin") and "Memory Design Using One-Transistor Gain Cell on SOI", T. Ohsawa et al., pp. 152-153, Tech. Digest, 2002 IEEE International Solid-State Circuits Conference, February 2002 ("Ohsawa"), which are hereby incorporated herein, in their entireties, by reference thereto) and on bulk silicon substrate (see, for example, "Further Insight Into the Physics and Modeling of Floating-Body Capacitorless DRAMs", A. Villaret et al., pp. 2447-2454, IEEE Transactions on Electron Devices, vol. 52, no. 11, November 2005 ("Villaret"), "Scaled 1T-Bulk Devices Built with CMOS 90 nm Technology for Low-cost eDRAM Applications", R. Ranica, et al., pp. 38-41, Tech. Digest, Symposium on VLSI Technology, 2005 ("Ranica"), and "Simulation of Intrinsic Bipolar Transistor Mechanisms for future capacitor-less eDRAM on bulk substrate", R. Pulicani et al., pp. 966-969, 2010 17th IEEE International Conference on Electronics, Circuits, and Systems, December 2010 ("Pulicani"), which are hereby incorporated herein, in their entireties, by reference thereto). Such memory eliminates the capacitor used in the conventional 1T/1C memory cell, and thus is easier to scale to smaller feature size. In addition, such memory allows for a smaller cell size compared to the conventional 1T/1C memory cell. Similar to the 1T/1C DRAM memory cell, the floating body DRAM memory cell only has one stable state in a memory cell, and thus requires periodic refresh operations to restore the state of the memory cell.

A bi-stable floating body memory cell, where more than one stable state exists for each memory cell, has been described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto.

Previous disclosures on floating body memory cell formed on bulk silicon substrate requires a buried well layer and insulating layers to isolate a floating body region.

SUMMARY OF THE INVENTION

In one aspect of the present invention, a semiconductor memory cell includes: a floating body region configured to be charged to a level indicative of a state of the memory cell selected from at least first and second states; a first region in electrical contact with the floating body region; a second region in electrical contact with said floating body region and spaced apart from the first region; a gate positioned between the first and second regions; a first insulating region located above the floating body region; second insulating regions adjacent to the floating body region; a buried layer region located below the floating body region and the second insulating regions and spaced from the second insulating regions so as not to contact the second insulating regions, wherein the floating body region is bounded by the first insulating region above the floating body region, the second insulating regions adjacent to the floating body region, and a depletion region formed as a result of an application of a back bias to the buried layer region.

In at least one embodiment, the semiconductor memory cell further comprises a substrate region, wherein the buried layer region is positioned between the substrate region and the floating body region.

In at least one embodiment, the first region has a first conductivity type selected from a p-type conductivity type and an n-type conductivity type; the second region has a first conductivity type selected from a p-type conductivity type and an n-type conductivity type; the floating body region has a second conductivity type selected from a p-type conductivity type and an n-type conductivity type and different from the first conductivity type; and the buried layer region has the first conductivity type.

In at least one embodiment, the back bias is applied to the buried layer region as a constant positive voltage bias or pulsed positive bias.

In at least one embodiment, the buried layer region is configured to inject charge into or extract charge out of the floating body region to maintain the state of the memory cell.

In at least one embodiment, the floating body region, the first region, the second region, the gate, the first insulating region, the second insulating regions and the buried layer form a memory device, and the semiconductor memory cell further comprises an access transistor connected in series with the memory device.

In another aspect of the present invention, a semiconductor memory cell includes: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; a buried layer region located below the floating body region and the second insulating regions and spaced from the second insulating regions so as not to contact the second insulating regions, wherein the floating body region is bounded by the first insulating region above the floating body region, the second insulating regions adjacent to the floating body region, and a top boundary of depletion region formed to the buried layer region as a result of an application of a back bias, and wherein application of the back bias results in at least two stable floating body charge levels.

In at least one embodiment, the semiconductor memory cell further includes a substrate region, wherein the buried layer region is positioned between the substrate region and the floating body region.

In at least one embodiment, the first region has a first conductivity type selected from a p-type conductivity type and an n-type conductivity type; the second region has the first conductivity type; the floating body region has a second conductivity type selected from a p-type conductivity type and an n-type conductivity type and different from the first conductivity type; and the buried layer region has the first conductivity type.

In at least one embodiment, the back bias is applied to the buried layer region as a constant positive voltage bias or pulsed positive voltage.

In at least one embodiment, the buried layer region is configured to inject charge into or extract charge out of the floating body region to maintain the state of the memory cell.

In at least one embodiment, the floating body region, the first region, the second region, the gate, the first insulating region, the second insulating regions and the buried layer form a memory device, and the semiconductor memory cell further includes an access transistor connected in series with the memory device.

In another aspect of the present invention, a semiconductor memory array includes at least two memory cells, wherein each memory cell includes: a floating body region configured to be charged to a level indicative of a state of the memory cell selected from at least first and second states; a first region in electrical contact with the floating body region; a second region in electrical contact with the floating body region and spaced apart from the first region; a gate positioned between the first and second regions; a first insulating region located above the floating body region; second insulating regions adjacent to the floating body region; a buried layer region located below the floating body region and the second insulating regions, wherein at least one of the second insulating regions adjacent to the floating body region insulates the memory cell from an adjacent memory cell.

In at least one embodiment, the semiconductor memory cells each further include a substrate region, wherein the buried layer region is positioned between the substrate region and the floating body region.

In at least one embodiment, the first region has a first conductivity type selected from a p-type conductivity type and an n-type conductivity type; the second region has the first conductivity type; the floating body region has a second conductivity type selected from a p-type conductivity type and an n-type conductivity type and different from the first conductivity type; and the buried layer region has the first conductivity type.

In at least one embodiment, the back bias is applied to the buried layer region as a constant positive voltage bias or pulsed positive voltage.

In at least one embodiment, the buried layer region is configured to inject charge into or extract charge out of the floating body region to maintain the state of the memory cell.

In at least one embodiment, the floating body region, the first region, the second region, the gate, the first insulating region, the second insulating regions and the buried layer form a memory device, and the semiconductor memory cell further comprises an access transistor connected in series with the memory device.

In another aspect of the present invention, a floating body memory cell is formed on bulk silicon substrate (or other semiconductor materials) which is isolated by a depletion region formed through application of a bias condition on a back bias region.

These and other features of the invention will become apparent to those persons skilled in the art upon reading the details of the devices and methods as more fully described below.

DETAILED DESCRIPTION OF THE INVENTION

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a memory cell" includes a plurality of such memory cells and reference to "the region" includes reference to one or more regions and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1A:
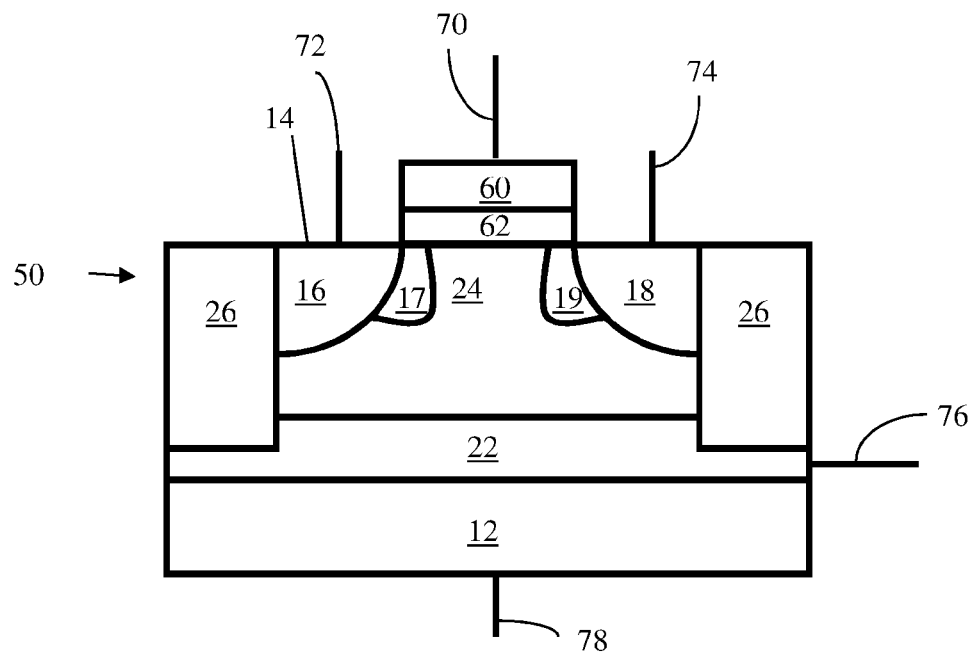
FIG. 1A is a schematic, cross-sectional illustration of a memory cell according to the present invention.
Figure 1B:
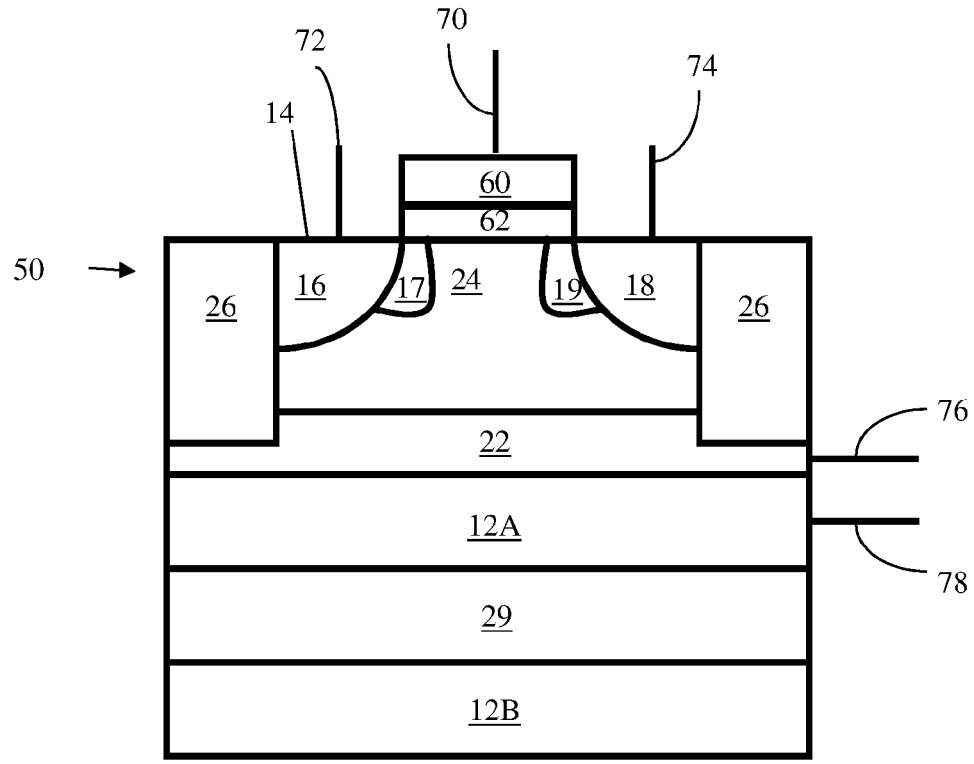
FIG. 1B is a schematic, cross-sectional illustration of a memory cell according to another embodiment of the present invention.

A schematic cross-sectional view of a memory device 50, according to an embodiment of the present invention, is shown in FIG. 1A. Memory cell 50 includes a substrate 12 of a first conductivity type such as p-type, for example. Substrate 12 is typically made of silicon, but may additionally or alternatively comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12A can be a well of the first conductivity type embedded in either a well 29 of the second conductivity type (e.g., n-type, when the first conductivity type is p-type, or vice versa) in the bulk of the semiconductor wafer 12B of the first conductivity type or, alternatively, in the bulk of the semiconductor wafer of the second conductivity type, such as n-type, for example as shown in FIG. 1B. To simplify the description, the substrate 12 will usually be drawn as the semiconductor bulk material as it is in FIG. 1A.

Memory cell 50 also comprises a buried layer region 22 of a second conductivity type, such as n-type, for example; a floating body region 24 of the first conductivity type, such as p-type, for example; and source/drain regions 16 and 18 of the second conductivity type, such as n-type, for example. Buried layer 22 may be formed by an ion implantation process on the material of substrate 12. Alternatively, buried layer 22 can be grown epitaxially on top of substrate 12.

The floating body region 24 of the first conductivity is bounded on top by surface 14, source line region 16, drain region 18, and insulating layer 62, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18 having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and/or their nitrides.

Figure 3A:
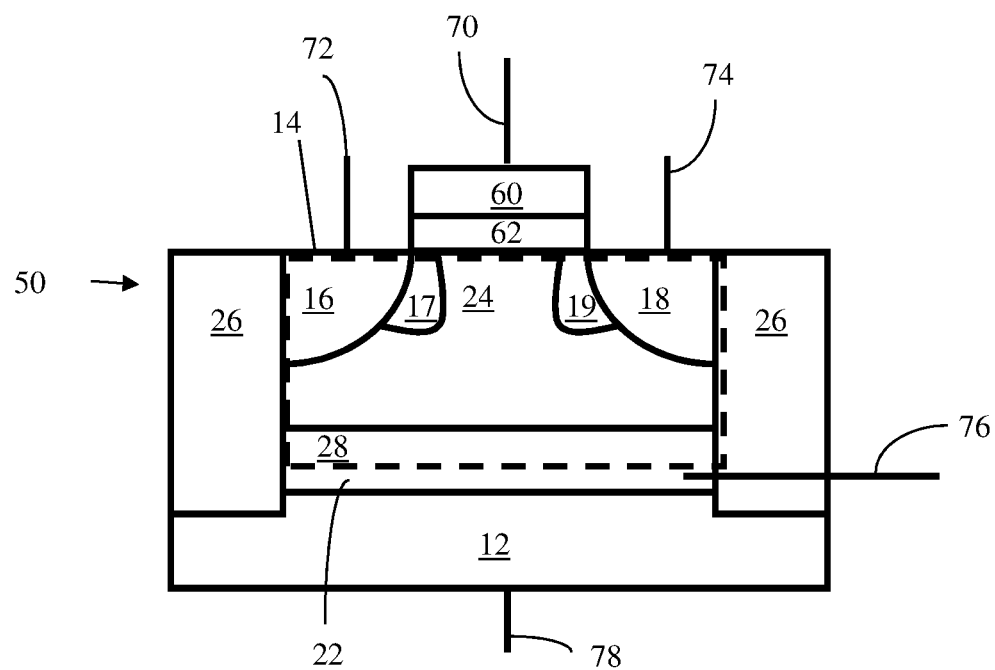
FIG. 3A is a schematic, cross-sectional illustration of a memory cell according to another embodiment of the present invention.
Figure 3B:
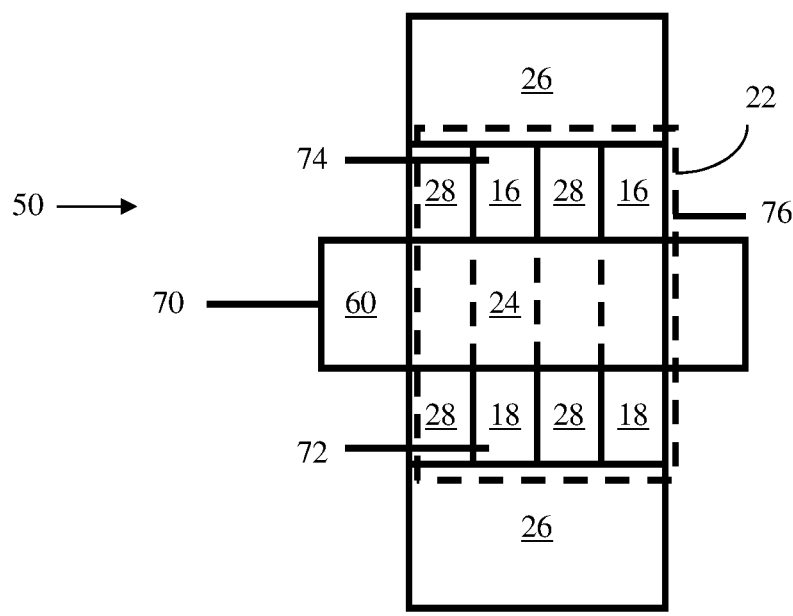
FIG. 3B is a schematic, top-view illustration of the memory cell shown in FIG. 3A.

Insulating layers 26 (like, for example, shallow trench isolation (STI)), may be made of silicon oxide, for example, though other insulating materials may be used. The bottom of insulating layer 26 may reside inside the buried region 22 allowing buried region 22 to be continuous as shown in FIG. 1. Alternatively, the bottom of insulating layer 26 may reside below the buried region 22 as in FIGS. 3A and 3B (shown better in FIG. 3A). This requires a shallower insulating layer 28, which insulates the floating body region 24, but allows the buried layer 22 to be continuous in the perpendicular direction of the cross-sectional view shown in FIG. 3A. For simplicity, only memory cell 50 with continuous buried region 22 in all directions will be shown from hereon. Alternatively, the bottom of insulating layer 26 may reside above the buried layer region 22.

Figure 2A:
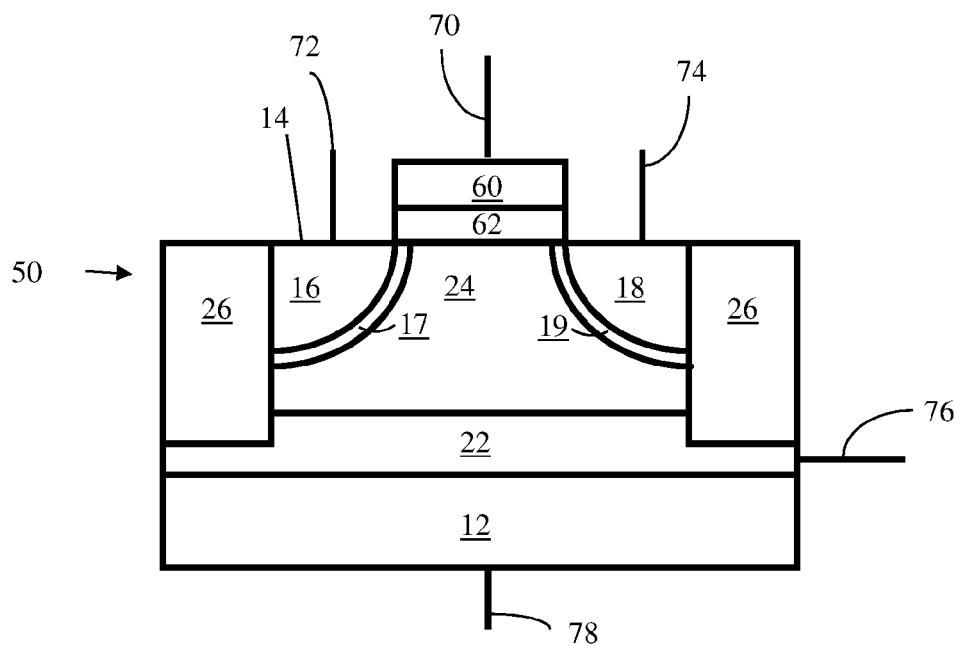
FIG. 2A is a schematic, cross-sectional illustration of a memory cell according to another embodiment of the present invention.
Figure 2B:
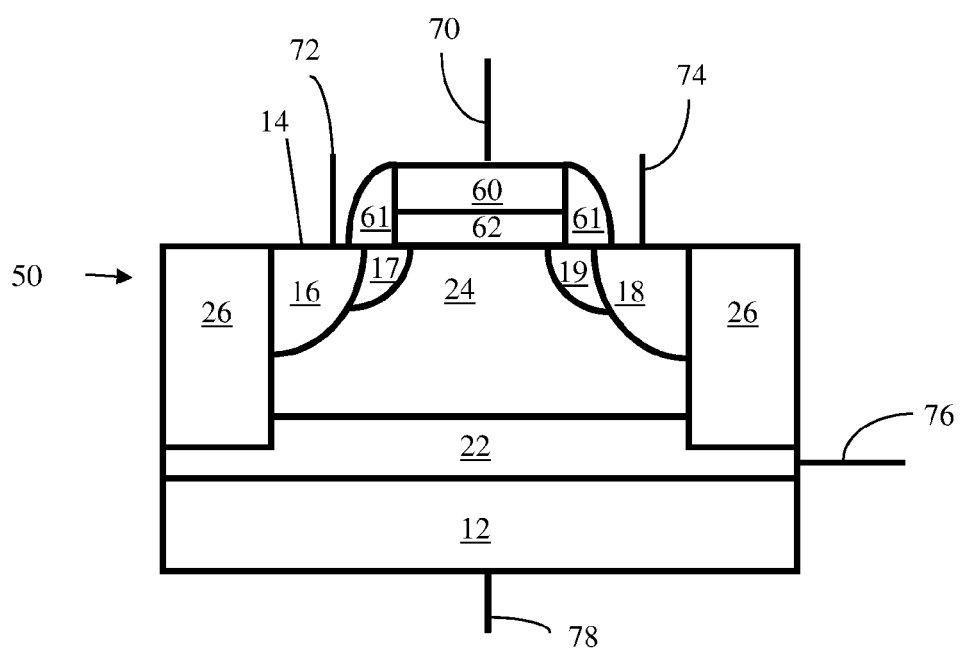
FIG. 2B is a schematic, cross-sectional illustration of a memory cell according to another embodiment of the present invention.
Figure 4A:
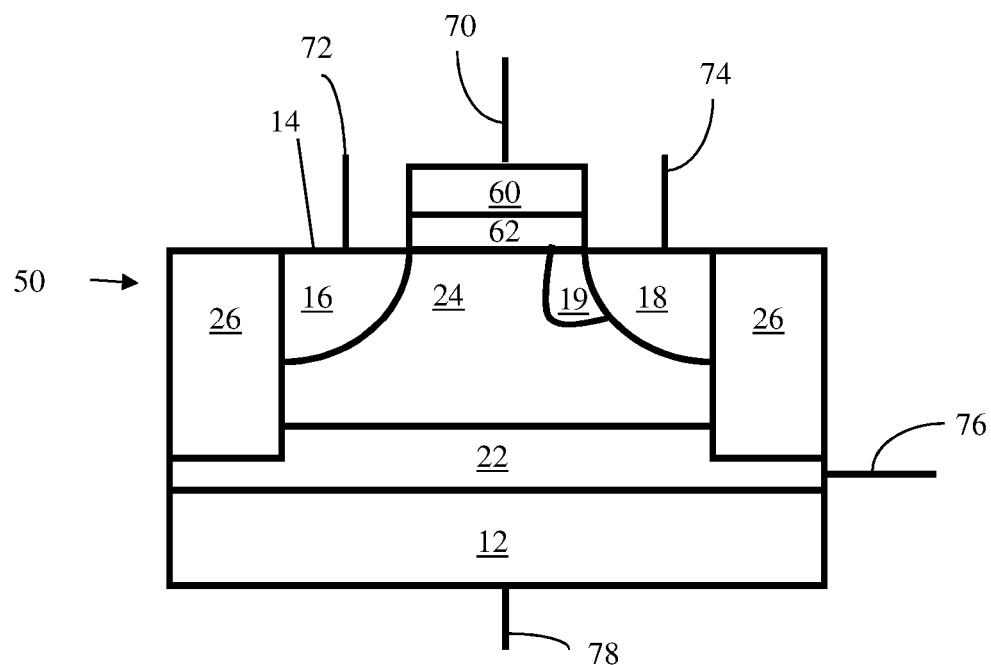
FIG. 4A is a schematic, cross-sectional illustration of a memory cell according to another embodiment of the present invention.
Figure 4B:
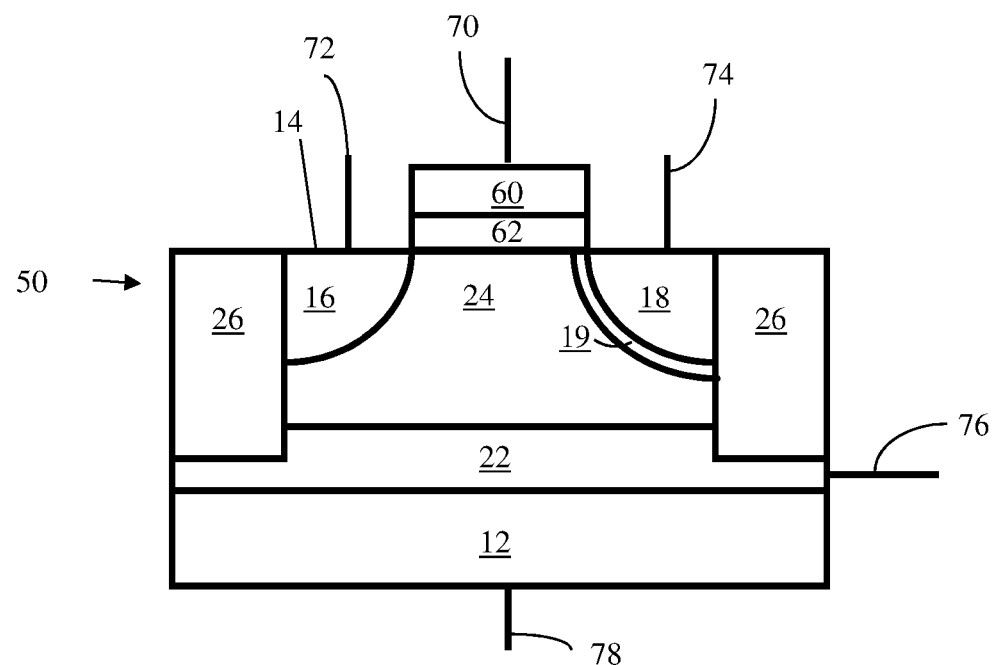
FIG. 4B is a schematic, cross-sectional illustration of a memory cell according to another embodiment of the present invention.
Figure 4C:
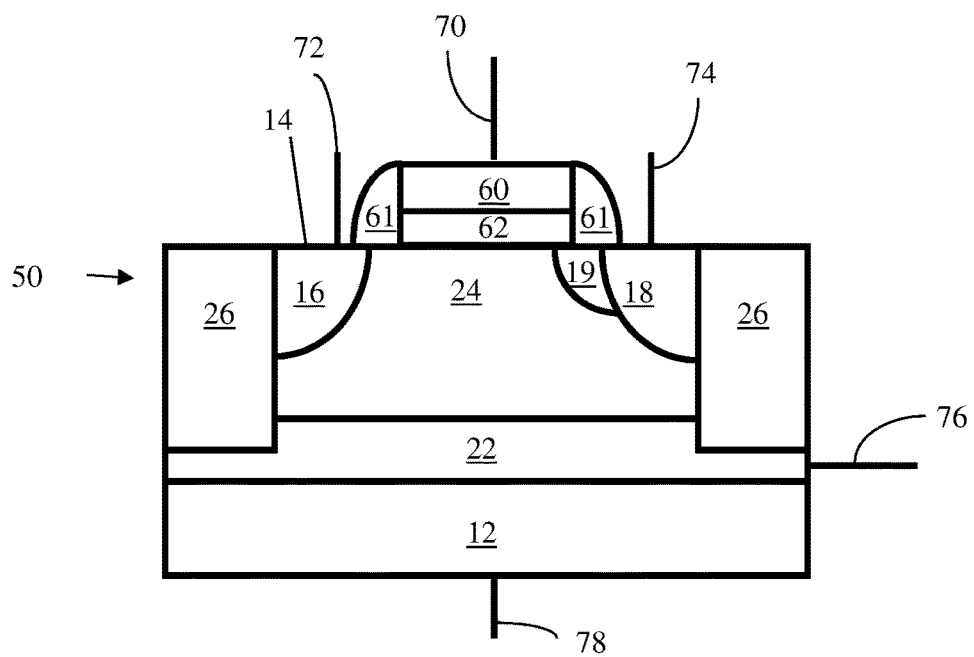
FIG. 4C is a schematic, cross-sectional illustration of a memory cell according to another embodiment of the present invention.

Memory cell 50 may comprise the regions 17 and 19 of the first conductivity type. The regions 17 and 19 of the first conductivity type can be pocket region as shown in FIGS. 1A and 1B. The regions located at an angle with respect to the surface 14 can be referred as halo regions 17 and 19 as shown in FIG. 2A. The regions 17 and 19 of the first conductivity type can also be formed under the spacer regions 61 as shown in FIG. 2B. Alternatively, the region 19 of the first conductivity type can be asymmetrically located near the bit line region 18, as shown in FIGS. 4A-4C. The regions 17 and 19 of the first conductivity type will be referred to as halo regions hereafter for simplicity.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. The doping concentration of the halo region 17 and/or 19 is such that the built-in electric field potential between the halo region 17 and the source region 16 and/or between the halo region 19 and the drain region 18 is high enough to result in lower potential for band-to-band tunneling across the halo region and the source/drain region. To harness the lower potential for band-to-band tunneling, the doping concentration of the first conductivity type region 17 and/or 19 should be high, and is preferentially greater than $5 \times 10^{18}$ but not to exceed $5 \times 10^{19}/cm^3$.

Figure 5A:
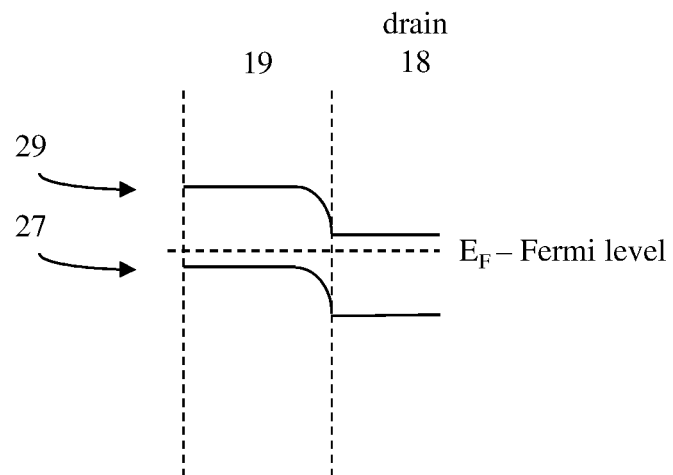
FIGS. 5A and 5B illustrate the energy band diagram formed by the halo region and the drain region under equilibrium condition and when a positive bias is applied to the drain region, respectively.
Figure 5B:
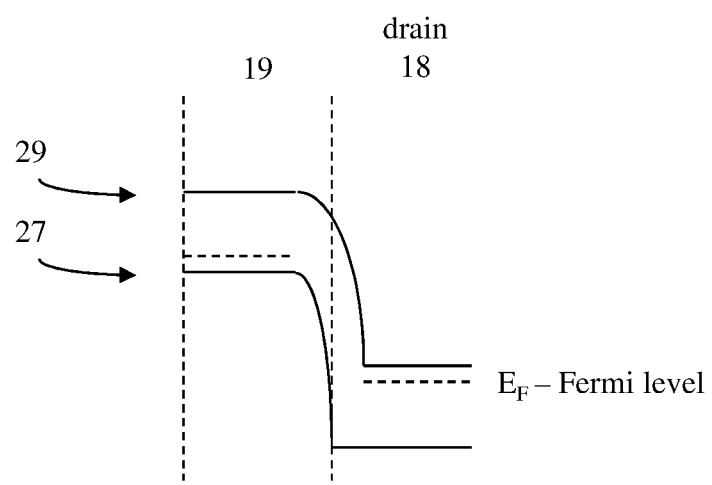

FIGS. 5A and 5B illustrate the band diagram of the halo region 19 and the drain region 18 for the halo region 19 with the conventional doping concentration and the halo region 19 with the high doping concentration, respectively. FIGS. 5A and 5B illustrate the band diagram when the halo region 19 is of p-type conductivity and the drain region 18 is of n-type conductivity, and assumes the same voltages are applied to the source region 16. Under reverse bias conditions as shown in FIG. 5B, electrons may tunnel from the valence band of the halo region 19 to the conduction band of the drain region 18, leaving excess holes to the floating body region 24 connected to the halo region 19.

Several operations can be performed by memory cell 50 such as holding, read, write logic-1 and write logic-0 operations, and have been described for example in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto. In prior art, the lower limit of the drain region 18 voltage for writing logic-1 operation using impact ionization is approximately 1.2 V, greater than the band-gap of silicon semiconductor. However, due to the inherent energy band-bending, the write logic-1 voltage of the memory cell 50 can be scaled to a voltage less than 1.2V through the formation of high concentration halo region 17 and/or 19, where band-to-band tunneling is intrinsically present at low voltage of the drain region 18.

Figure 6:
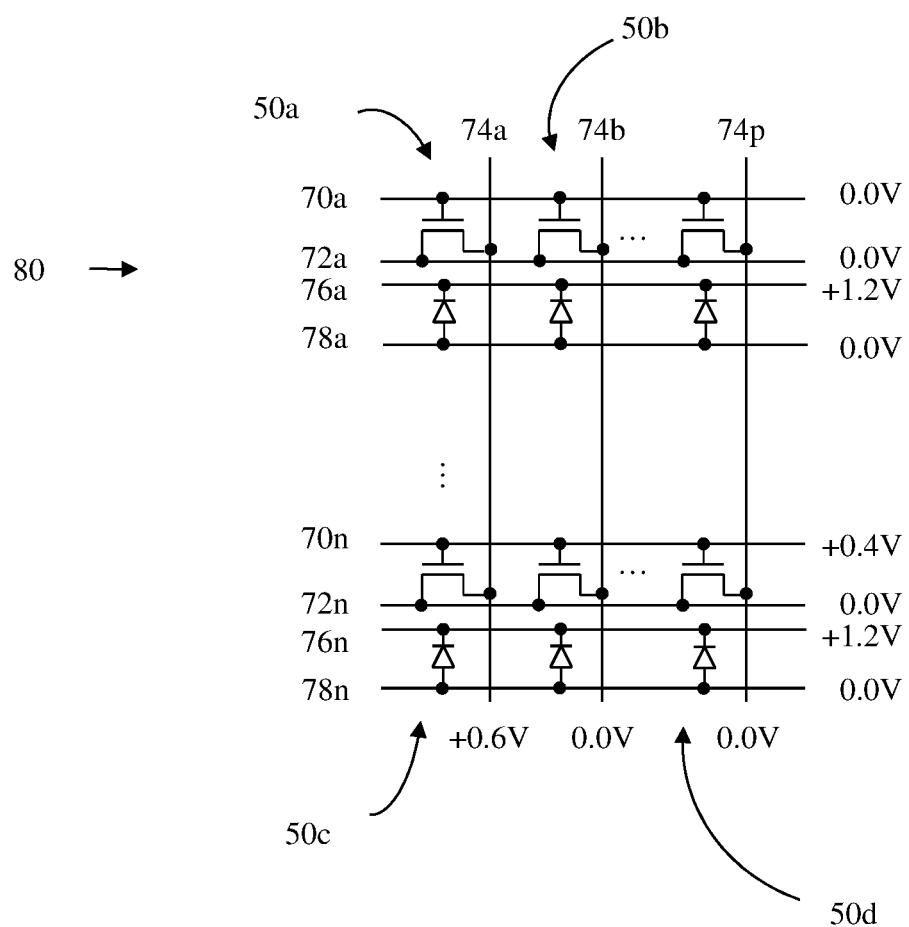
FIG. 6 schematically illustrates a write logic-1 operation performed on a memory array according to an embodiment of the present invention.
Figure 7:
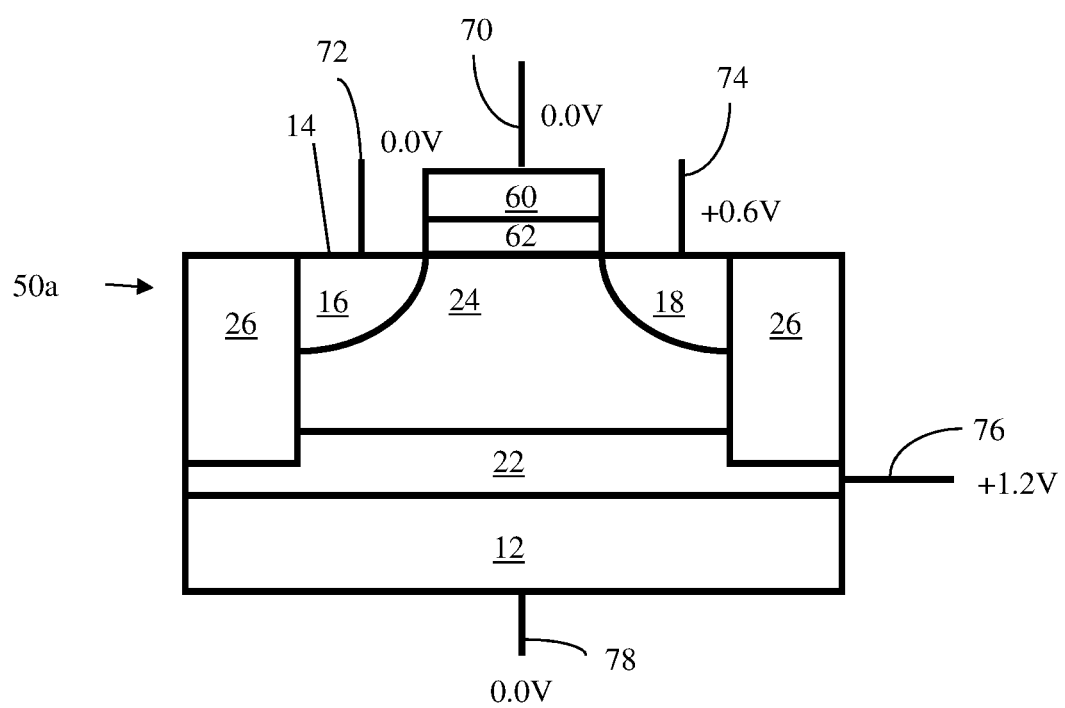
FIG. 7 illustrates bias conditions applied on the terminals of a memory cell to perform a write logic-1 operation, according to an embodiment of the present invention.

FIGS. 6 and 7 illustrate the operating conditions for a write logic-1 operation, where the following bias conditions are applied: a positive voltage is applied to the BW terminal 76a, zero voltage is applied to the SL terminal 72a, a positive voltage is applied to the BL terminal 74a, zero voltage is applied to the WL terminal 70a, while zero voltage is applied to the substrate terminal 78. The positive voltage applied to the BL terminal 74 is sufficiently high to cause hole tunneling from the drain region 16 to the floating body 24. When cell 50 is in an array 80, the unselected BL terminals 74 (e.g. 74b, . . . , 74n) will be at zero voltage, and all SL terminals 72 will be at zero voltage, the unselected WL terminals 70 (e.g. 70n and any other WL terminals 70 not connected to selected cell 50a) will be at a slight positive voltage. The slight positive voltage applied on the unselected WL terminals 70 increases the potential of the floating bodies 24, and reduces the electric field between the drain regions 18 and the halo regions 19. As a result, no hole injection (or significantly less hole injection) is observed on the unselected cells 50. In one particular non-limiting embodiment, about +0.6 volts is applied to the selected BL terminal 74a, about 0.0 volts is applied to the selected SL terminal 72a, about 0.0 volts is applied to the selected WL terminal 70a, about +1.2 volts is applied to BW terminal 76a, and about 0.0 volts is applied to terminal 78, as illustrated in FIGS. 6 and 7.

The unselected BL terminals 74 are at 0.0 volts, the unselected SL terminals 72 are at 0.0 volts, the unselected WL terminals 70 are at +0.4 volts, about +1.2 volts is applied to the unselected BW terminals 76, and about 0.0 volts is applied to the unselected substrate terminals 78. However, these voltage levels may vary while maintaining the relative relationships between voltage levels as generally described above.

Figure 8A:
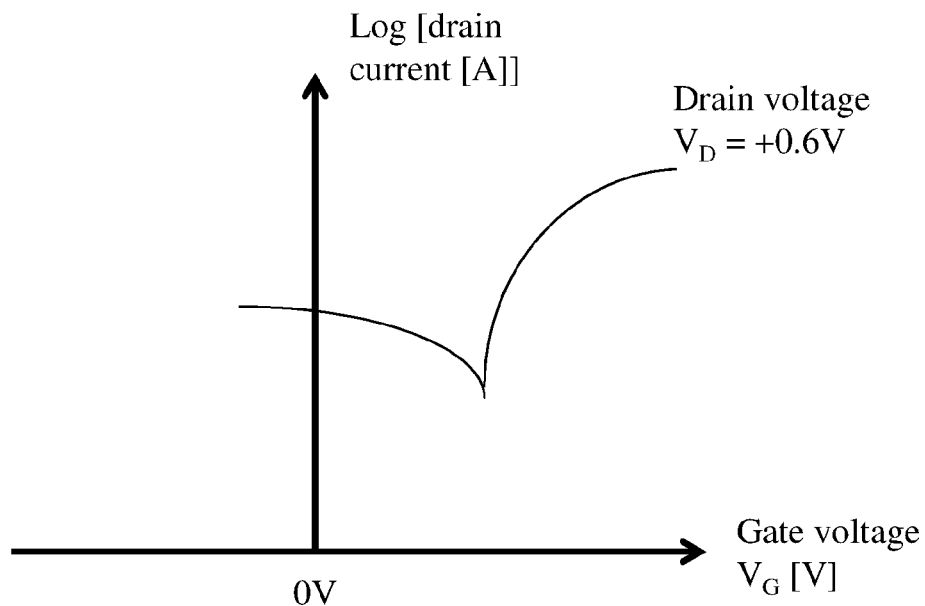
FIGS. 8A and 8B illustrate a graph of the drain current as a function of the gate voltage for a memory cell with high tunneling current according to an embodiment of the present invention and for a memory cell with low tunneling current, respectively.
Figure 8B:
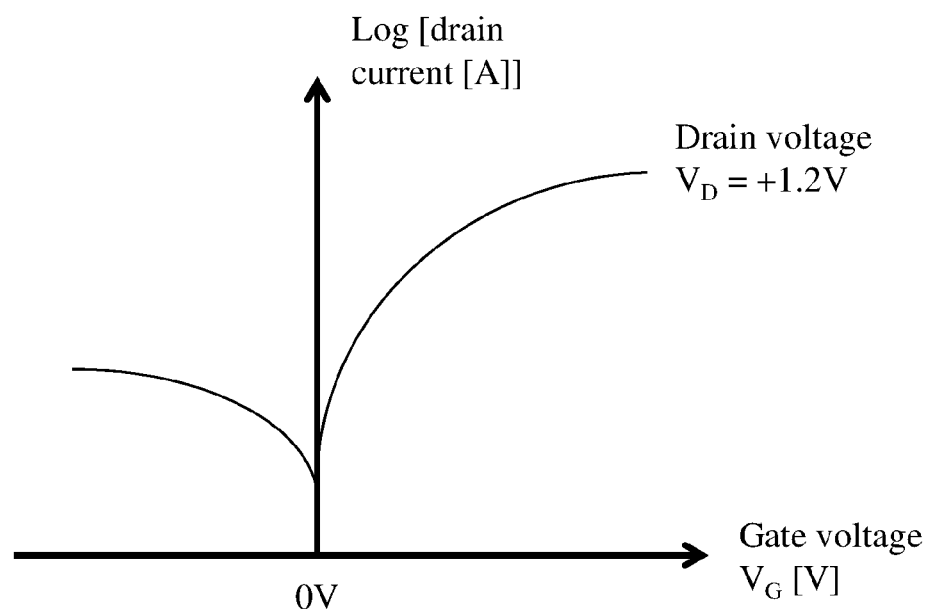

FIGS. 8A and 8B show a comparison between the drain current and gate voltage relationship of the memory cell 50 with a high tunneling current according to the present invention (FIG. 8A) and that of a conventional memory cell with a low tunneling current (FIG. 8B), respectively. With a high tunneling current cell 50 of the present invention, because the intrinsic energy band-bending is large enough to create band-to-band tunneling as explained with regard to FIG. 5B, the operating voltage where high hole injection current is observed is when lower than +1.2V is applied to the drain region and about zero voltage is applied to the gate region (connected to the WL terminal). For a conventional memory cell with a low tunneling current, because the intrinsic energy band-bending is not enough to cause the band-to-band tunneling, the high hole injection current occurs only when a negative voltage is applied to the gate electrode in order to electrically bend the energy band. Due to the higher hole injection current (as a result of the halo regions 17 and/or 19 having a high doping concentration that results in a high built-in electric field), the high tunneling current memory cell 50 does not require negative voltage for the write logic-1 operation, which simplifies the design of the periphery circuitry due to absence of (lack of requirement for) a negative voltage generator. In addition, the voltage applied to the drain region 18 of the high tunneling current memory cell 50 is also lower compared to that of the low tunneling current cell.

Figure 9:
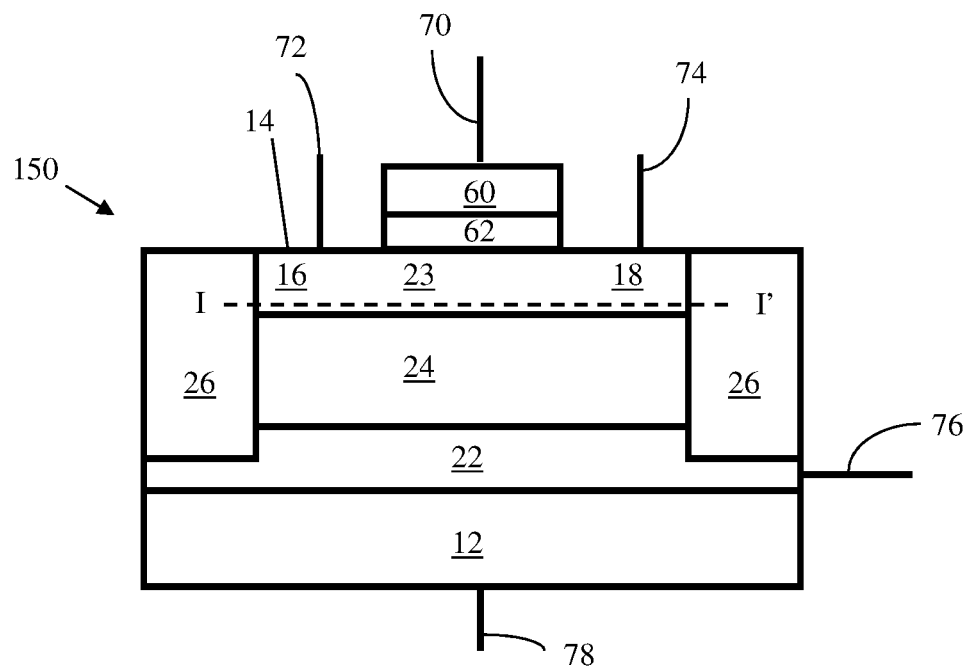
FIG. 9 is a schematic, cross-sectional illustration of a memory cell according to another embodiment of the present invention.

FIG. 9 illustrates memory cell 150 according to another embodiment of the present invention. Memory cell 150 is constructed as a bulk planar junctionless memory cell transistor, where the channel region 23 have the same conductivity type as the source and drain regions 16 and 18 as described for example in "Bulk Planar Junctionless Transistor (BPJLT): An Attractive Device Alternative for Scaling", S. Gundapaneni et al., pp. 261-263, IEEE Electron Device Letters, vol. 32, no. 3, March 2011 ("Gundapaneni"), which is hereby incorporated herein, in its entirety, by reference thereto. The lateral doping concentration across the I-I' cut line near the surface region 14 is uniform and of the same conductivity type. The thickness of the channel region 23 has to be thin enough for the gate to fully deplete its majority carrier during when zero voltage is applied to the gate region 60. In one particular embodiment, the thickness of the channel region 23 is about 10 nm. However, the thickness may vary depending on the thickness of the gate dielectric 62 and the work function of the gate 60 (see below).

Memory cell 150 includes a substrate 12 of a first conductivity type such as p-type, for example. Substrate 12 is typically made of silicon, but may additionally or alternatively comprise, for example, germanium, silicon germanium, gallium arsenide, carbon nanotubes, and/or other semiconductor materials. In some embodiments of the invention, substrate 12 can be the bulk material of the semiconductor wafer.

Memory cell 150 also comprises a buried layer region 22 of a second conductivity type, such as n-type, for example, and a floating body region 24 of the first conductivity type, such as p-type, for example. Buried layer 22 may be formed by an ion implantation process on the material of substrate 12. Alternatively, buried layer 22 can be grown epitaxially on top of substrate 12.

The floating body region 24 of the first conductivity type is bounded on top by channel region 23, source line region 16, and drain region 18, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A gate 60 is positioned in between the source line region 16 and the drain region 18, above the channel region 23. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides, where the gate electrode 60 has a high work function. Also, high work function gate materials such as valence-band edge metal or p-type polysilicon may be used to form the gate 60. The high work function of the gate electrode 60 will fully deplete the majority carrier of the channel region 23 near the surface when zero voltage is applied to the gate electrode 60, turning off the conduction path between the source region 16 and the drain region 18.

Insulating layers 26 (like, for example, shallow trench isolation (STI)), may be made of silicon oxide, for example, though other insulating materials may be used. The bottom of insulating layer 26 may reside inside the buried region 22 allowing buried region 22 to be continuous as shown in FIG. 9. Alternatively, the bottom of insulating layer 26 may reside below the buried region 22 (see for example FIGS. 3A and 3B). For simplicity, only memory cell 150 with continuous buried region 22 in all directions will be shown from hereon. Alternatively, the bottom of insulating layer 26 may reside above the buried layer region 22.

Cell 150 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. The states of the memory cell 150 are determined from the charge stored in the floating body region 24. If the floating body region 24 is positively charged, the conductivity of the memory cell 150 (for example the current flow from the BL terminal 74 to the SL terminal 72) will be higher than if the floating body region is neutral. The high conductivity state will be referred to as the logic-1 state, while the low conductivity state will be referred to as the logic-0 state. The same operations performed on memory cell 50 can be performed on memory cell 150 such as holding, read, write logic-1 and write logic-0 operations. The drain voltage applied during write logic-1 state using impact ionization mechanism can be reduced on junctionless memory cell transistor 150, because of the higher impact ionization generation on junctionless transistor, for example as described in "Low subthreshold slope in junctionless multi gate transistors", C.-W. Lee et al., pp. 102106, Applied Physics Letter 96, 2010 ("Lee"), which is hereby incorporated herein, in its entirety, by reference thereto. In one particular non-limiting embodiment, about +1.0 volts is applied to the selected BL terminal 74a, about 0.0 volts is applied to the selected SL terminal 72a, about 0.0 volts is applied to the selected WL terminal 70a, about +1.2 volts is applied to BW terminal 76a, and about 0.0 volts is applied to terminal 78a. The unselected BL terminals 74 are at 0.0 volts, the unselected SL terminals 72 are at 0.0 volts, the unselected WL terminals 70 are at 0.0 volts, about +1.2 volts is applied to the unselected BW terminals 76, and about 0.0 volts is applied to the unselected substrate terminals 78. However, these voltage levels may vary while maintaining the relative relationships between voltage levels as generally described above.

Figure 10:
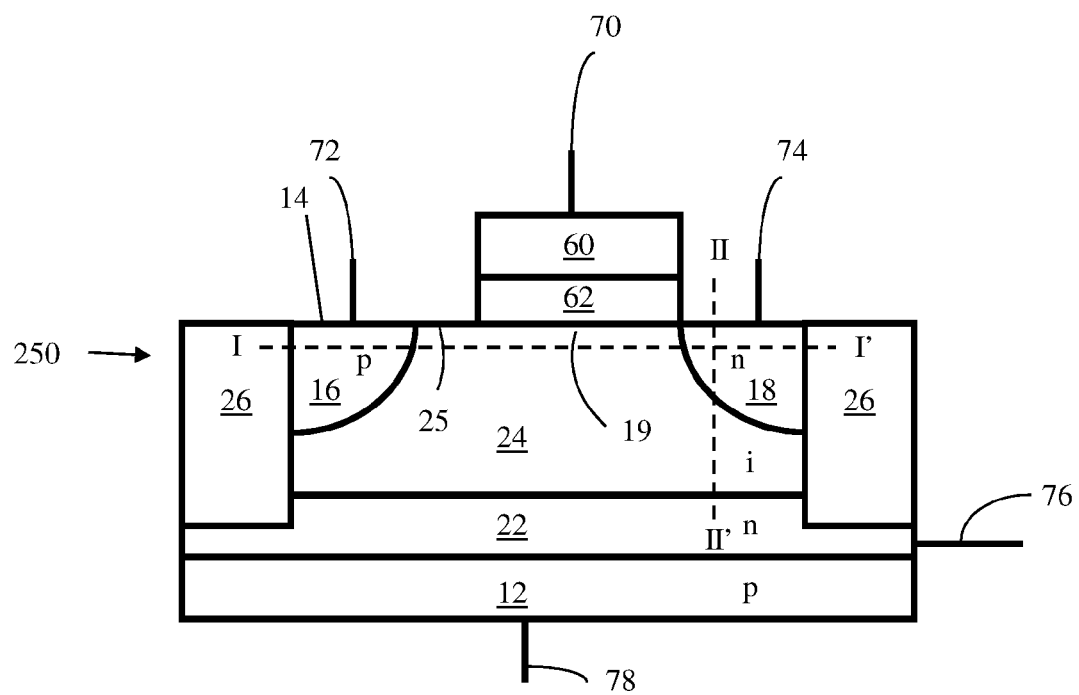
FIG. 10 is a schematic, cross-sectional illustration of a memory cell according to another embodiment of the present invention.

FIG. 10 illustrates memory cell 250 according to another embodiment of the present invention. Memory cell 250 also comprises substrate 12 of a first conductivity type such as p-type, for example, and a buried layer region 22 of a second conductivity type, such as n-type, for example. Memory cell 250 also comprises an intrinsic-type floating body region 24, where no significant amount of dopant species is present. The floating body region 24 is bounded on top by the surface 14, the insulating layer 62, and the source region 16, and drain region 18. The source region 16 has a first conductivity type such as p-type, for example, while the drain region 18 has a second conductivity type such as n-type, for example. As a result, near the surface region (along the I-I' cut line shown in FIG. 10, a p-i-n diode is formed from the source region 16, the floating body region 24, and the drain region 18).

A gate 60 is positioned in between the source line region 16 and the drain region 18, but does not fully overlay the floating body region 24, where the gate region 60 is spaced from the source region 16, forming the gap region 25, for example as described in U.S. patent application Ser. No. 13/244,899 to Y. Widjaja, titled "Asymmetric Semiconductor Memory Device Having Electrically Floating Body Transistor" ("Widjaja-3"), which is hereby incorporated herein, in its entirety, by reference thereto.

Insulating layers 26 (like, for example, shallow trench isolation (STI)), may be made of silicon oxide, for example, though other insulating materials may be used. The bottom of insulating layer 26 may reside inside the buried region 22 allowing buried region 22 to be continuous as shown in FIG. 10. Alternatively, the bottom of insulating layer 26 may reside below the buried region 22 as in FIGS. 3A and 3B (shown better in FIG. 3A). This requires a shallower insulating layer 28, which insulates the floating body region 24, but allows the buried layer 22 to be continuous in the perpendicular direction of the cross-sectional view shown in FIG. 3A. For simplicity, only memory cell 250 with continuous buried region 22 in all directions will be shown from hereon. Alternatively, the bottom of insulating layer 26 may reside above the buried layer region 22.

Cell 250 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12.

Memory cell 250 conduction utilizes channel length modulation through the gate 60, as described for example in "Impact Ionization MOS (I-MOS)—Part I: Device and Circuit Simulations", K. Gopalakrishnan, et al., pp. 69-76, IEEE Transactions on Electron Devices, vol. 52, no. 1, January 2005 ("Gopalakrishnan"), which is hereby incorporated herein, in its entirety, by reference thereto. At low gate bias, no inversion is formed in the channel area underneath the gate 60. As the potential of the gate 60 is increased, an inversion layer forms underneath the gate 60. A strong electric field is developed across the gap region 25, sufficient to generate impact ionization.

The states of the memory cell 250 are determined from the charge stored in the floating body region 24. If the floating body region 24 is positively charged, the gate voltage where an inversion layer is formed under the gate 60 (often referred to as the threshold voltage), is lower than that if the floating body region 24 is neutral. The memory state having a lower threshold voltage will be referred to as the logic-1 state, while the memory state having a higher threshold voltage will be referred to as the logic-0 state.

Figure 11:
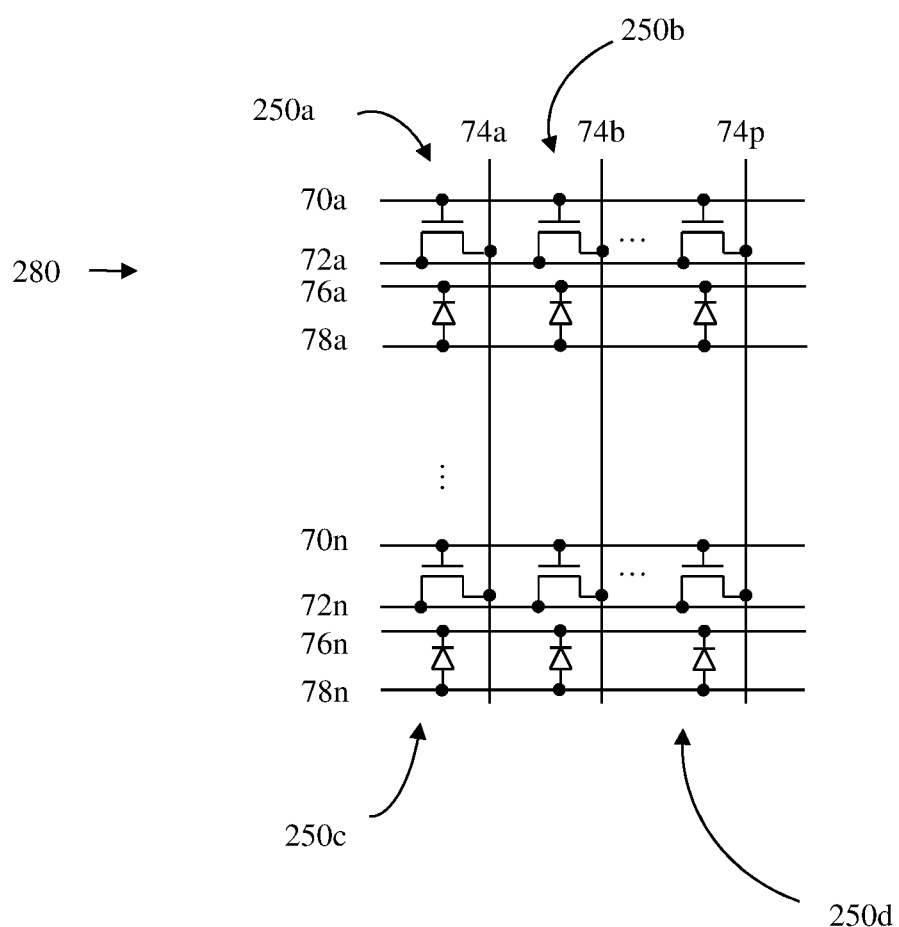
FIG. 11 schematically illustrates multiple memory cells joined to make a memory array.

FIG. 11 schematically illustrates an exemplary embodiment of a memory array 280 of memory cells 250 (four exemplary instances of memory cell 250 being labeled as 250a, 250b, 250c, and 250d) arranged in rows and columns.

In many, but not necessarily all, of the figures where array 280 appears, representative memory cell 250a will be representative of a "selected" memory cell 250 when the operation being described has one (or more in some embodiments) selected memory cells 250. In such figures, representative memory cell 250b will be representative of an unselected memory cell 250 sharing the same row as selected representative memory cell 250a, representative memory cell 250c will be representative of an unselected memory cell 250 sharing the same column as selected representative memory cell 250a, and representative memory cell 250d will be representative of a memory cell 250 sharing neither a row nor a column with selected representative memory cell 250a.

Present in FIG. 11 are word lines 70a through 70n, source lines 72a through 72n, bit lines 74a through 74p, buried well terminals 76a through 76n, and substrate terminal 78. Representation of the lines/terminal with letters a-n or a through p, includes not only embodiments which include literally twelve lines/terminals (i.e., a, b, c, d, e, f, g, h, i, j, k, l, m, n, o, p) or fourteen lines/terminals (i.e., a, b, c, d, e, f, g, h, i, j, k, l, m, n, o, p), but is meant to more generically represent a plurality of such line terminals, which can be less than twelve (i.e., as low as one or greater than twelve, thirteen or fourteen (much greater than fourteen up to any positive integer practical).

Each of the source lines 72a through 72n is associated with a single row of memory cells 250 and is coupled to the source line region 16 of each memory cell 250 in that row. Each of the bit lines 74a through 74p is associated with a single column of memory cells 250 and is coupled to the bit line region 18 of each memory cell 250 in that column.

Several operations can be performed on memory cell 250 such as holding, read, write logic-1 and write logic-0 operations.

Figure 12:
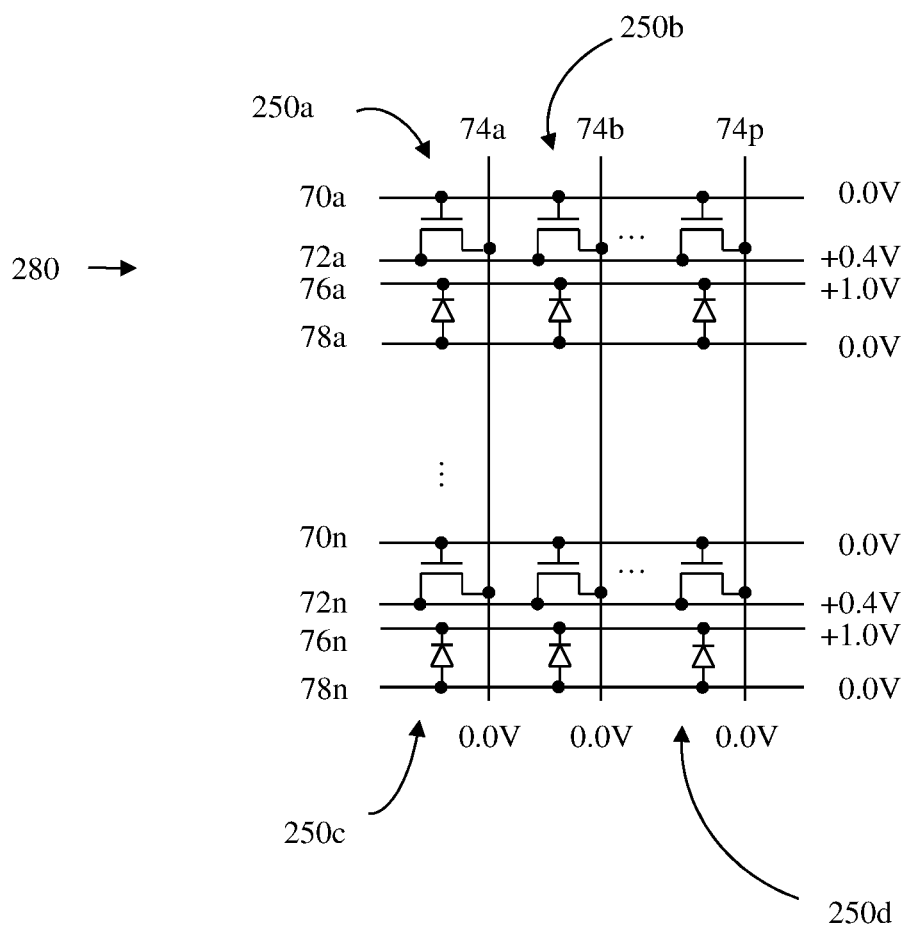
FIG. 12 schematically illustrates a holding operation performed on a memory array according to an embodiment of the present invention.
Figure 13:
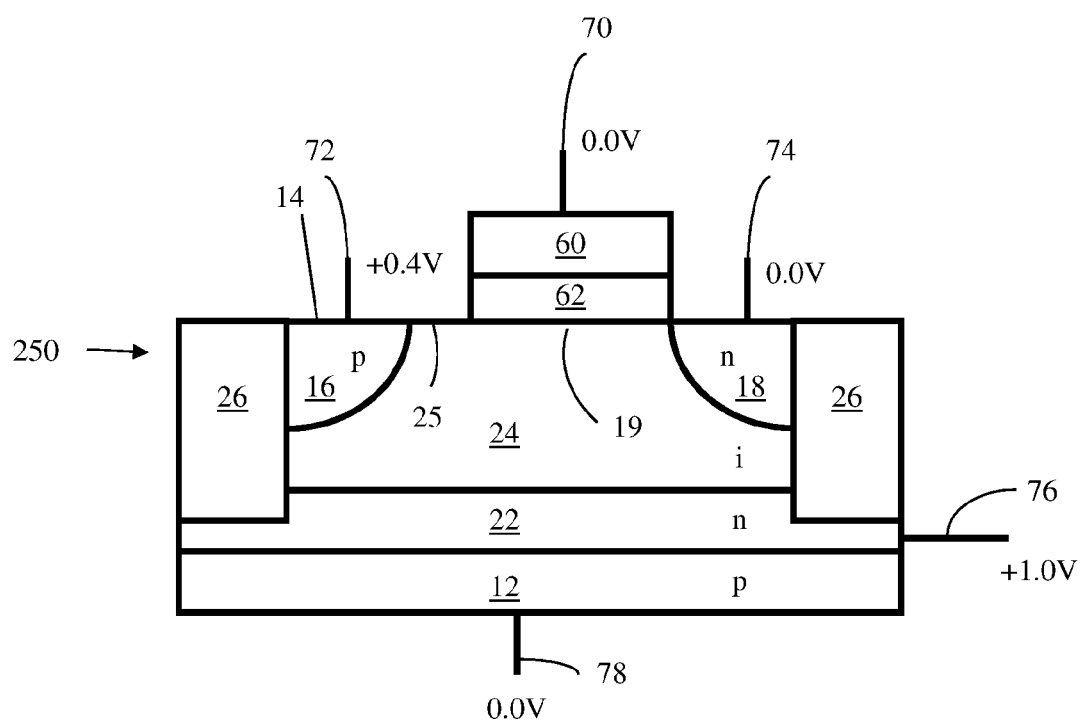
FIG. 13 illustrates bias conditions applied on the terminals of a memory cell to perform a holding operation, according to an embodiment of the present invention.

FIG. 12 schematically illustrates performance of a holding operation on memory array 280, while FIG. 13 illustrates the bias applied on the terminals of a memory cell 250 during the holding operation. The holding operation is performed by applying a positive back bias to the BW terminal 76, a slight positive bias to the SL terminal 72, zero bias on the WL terminal 70, BL terminal 74, and substrate terminal 78. The positive back bias applied to the buried layer region 22 connected to the BW terminal 76 will maintain the state of the memory cell 250. The positive bias applied to the BW terminal 76 needs to generate an electric field sufficient to trigger an impact ionization mechanism when the floating body region 24 is positively charged, as will be described through the band diagram shown in FIGS. 14A and 14B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 250 are: about 0.0 volts is applied to WL terminal 70, about 0.0 volts is applied to BL terminal 74, about +0.4 volts is applied to SL terminal 72, a positive voltage, for example, about +1.0 volts is applied to BW terminal 76, and about 0.0 volts is applied to the substrate terminal 78. In other embodiments, different voltages may be applied to the various terminals of memory cell 250 and the exemplary voltages described are not limiting.

Figure 14A:
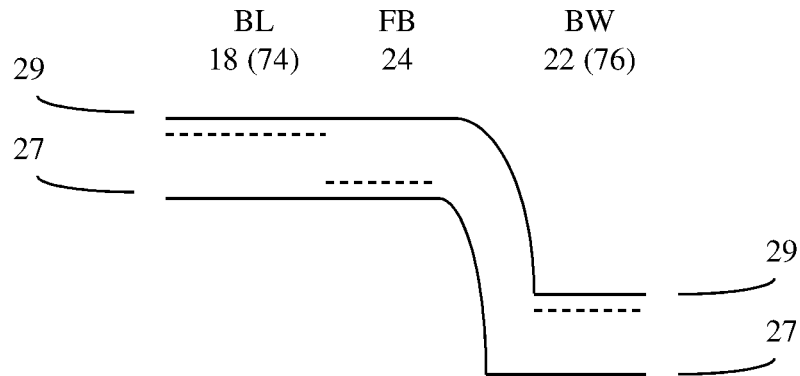
FIG. 14A shows an energy band diagram characterizing an intrinsic bipolar device when a floating body region is positively charged and a positive bias is applied to a buried well region of a memory cell according to an embodiment of the present invention.
Figure 14B:
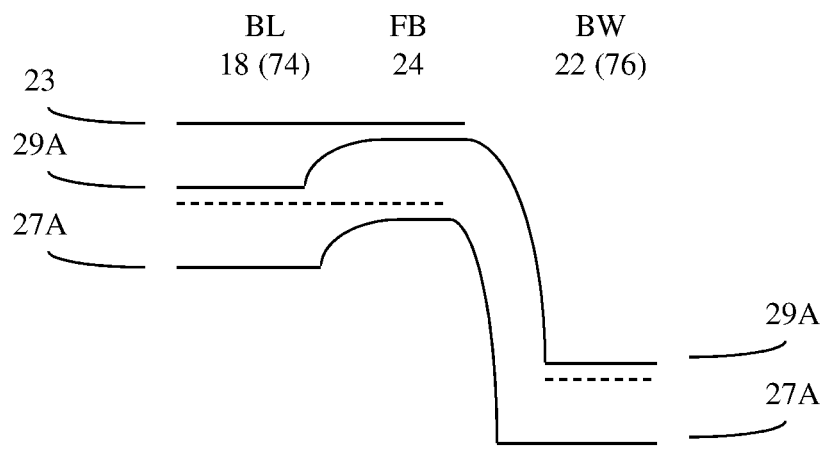
FIG. 14B shows an energy band diagram of an intrinsic bipolar device when a floating body region is neutrally charged and a positive bias is applied to a buried well region of a memory cell according to an embodiment of the present invention.

FIGS. 14A and 14B show band diagrams along the II-II' cut line from FIG. 10 illustrating an n-type drain region 18, an intrinsic floating body region 24, and an n-type buried well region 22, when the floating body is positively charged and when the floating body is neutral, respectively. The horizontal dashed lines indicate the Fermi levels in the various regions. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, electrons will flow from the drain region 18 to the buried well region 22 due the barrier lowering of the floating body region 24. As a result of the positive bias applied to the buried well region 22 (connected to the BW terminal 76), the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. When the following condition is met: $\beta \times (M-1) \approx 1$—where $\beta$ is the forward common-emitter current gain and M is the impact ionization coefficient—the amount of holes injected into the floating body region 24 compensates for the charge lost due to forward bias current between the floating body region 24 and the source line region 16 or bit line region 18 and due to holes recombination. This process maintains the charge (i.e. holes) stored in the floating body region 24 which will keep the electron flow from the drain region 18 to the buried well region 22 for as long as a positive bias is applied to the buried well region 22 through BW terminal 76.

The region where the product $\beta \times (M-1)$ approaches 1 and is characterized by hole current moving into the floating body region is similar to the reverse base current region that has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010"("J.-W., Han"), which is hereby incorporated herein, in its entirety, by reference thereto. In a two-terminal biristor device, a refresh operation is still required. J.-W. Han describes a 200 ms data retention for the silicon nanowire biristor memory. As will be described, the holding operation does not require any interruptions to the memory cell 250 access. As a result, the holding operation can be performed for as long as a positive bias is applied to the buried well region 22 through BW terminal 76.

If floating body 24 is neutrally charged, a state corresponding to logic-0, no (or low) electron flow will occur from the drain region 18 to the buried well region 22. As a result, no impact ionization occurs and memory cells in the logic-0 state will remain in the logic-0 state. FIG. 14B shows the corresponding energy band diagram when the floating body 24 is neutral and when zero voltage is applied to the drain region 18 and a positive bias is applied to the buried well region 22. In this state, an energy barrier, indicated by solid line 23, exists between the drain region 18 and the buried well region 22.

In the holding operation described with regards to FIGS. 12 and 13, there is no individually selected memory cell. Rather the holding operation will be performed at all cells connected to the same buried well terminal 76. In addition, the holding operation does not interrupt read or write access to the memory cell 250.

Figure 15:
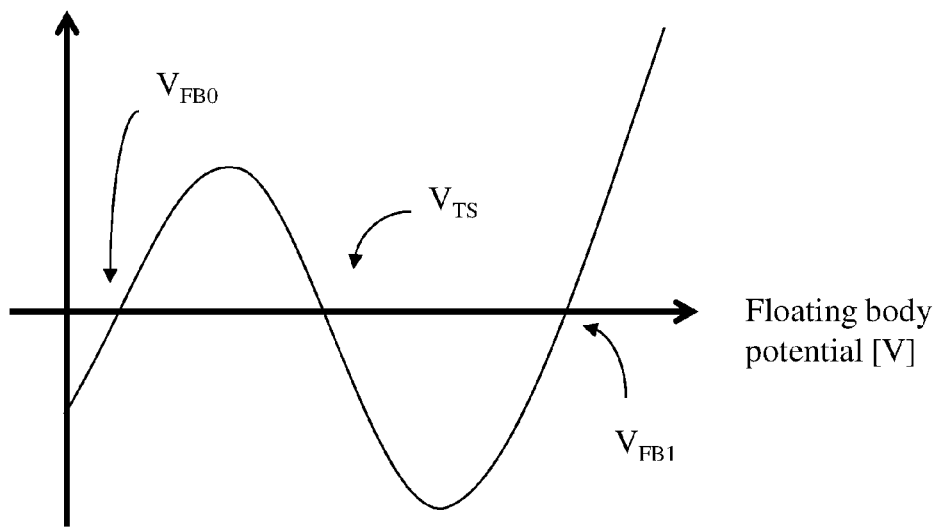
FIG. 15 shows a graph of the net current I flowing into or out of a floating body region as a function of the potential V of the floating body, according to an embodiment of the present invention.

FIG. 15 shows a graph of the net current I flowing into or out of the floating body region 24 as a function of the potential $V_{FB}$ of the floating body 24, where a slight positive voltage is applied to the source region 16, zero voltage is applied to the drain region 18, and a positive voltage is applied to the buried well region 22. A negative current indicates a net current flowing into the floating body region 24, while a positive current indicates a net current flowing out of the floating body region 24. At low floating body 24 potential, between 0V and $V_{FB0}$ indicated in FIG. 15, the net current is flowing into the floating body region 24 as a result of the junction between the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the junction formed by the floating body region 24 and the drain region 18 is forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the junction leakage current. When the floating body 24 potential is higher than $V_{FB1}$, the net current will be out of the floating body region 24. This is because the junction leakage current is once again greater than the base current flowing into the floating body region 24.

Figure 16A:
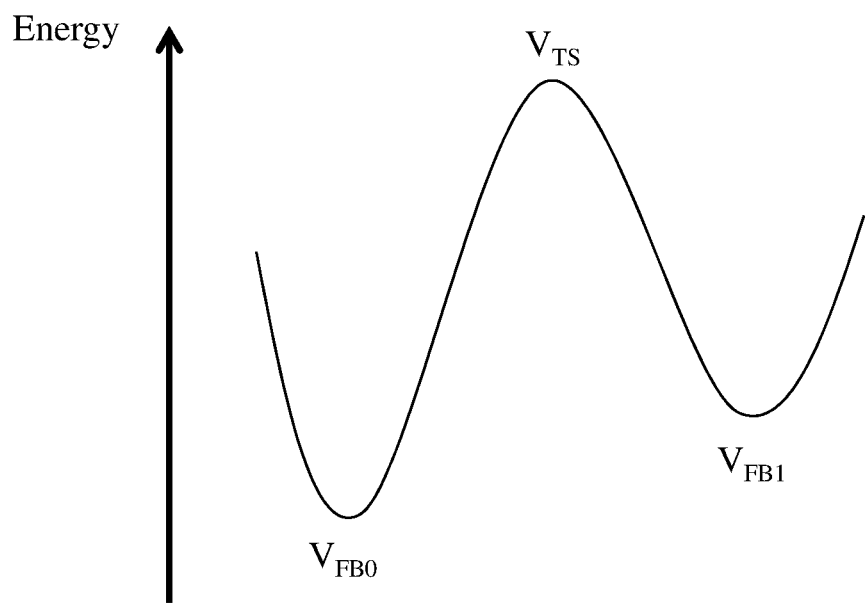
FIG. 16A shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$ and $V_{TS}$, respectively. FIG. 16A shows a schematic curve of a potential energy surface (PES) of the memory cell 250, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 16B:
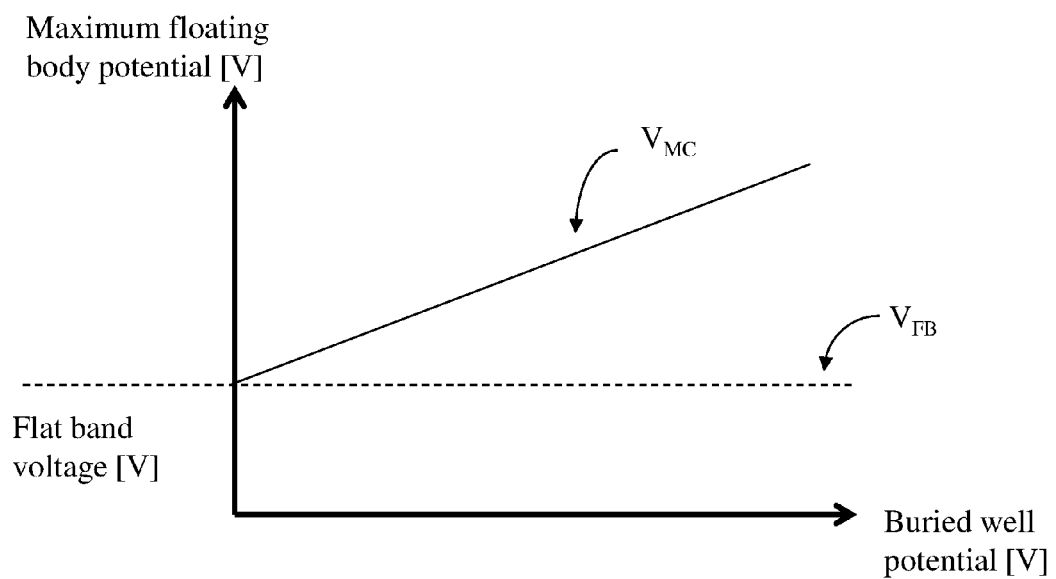
FIG. 16B illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 16B. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

Figure 17:
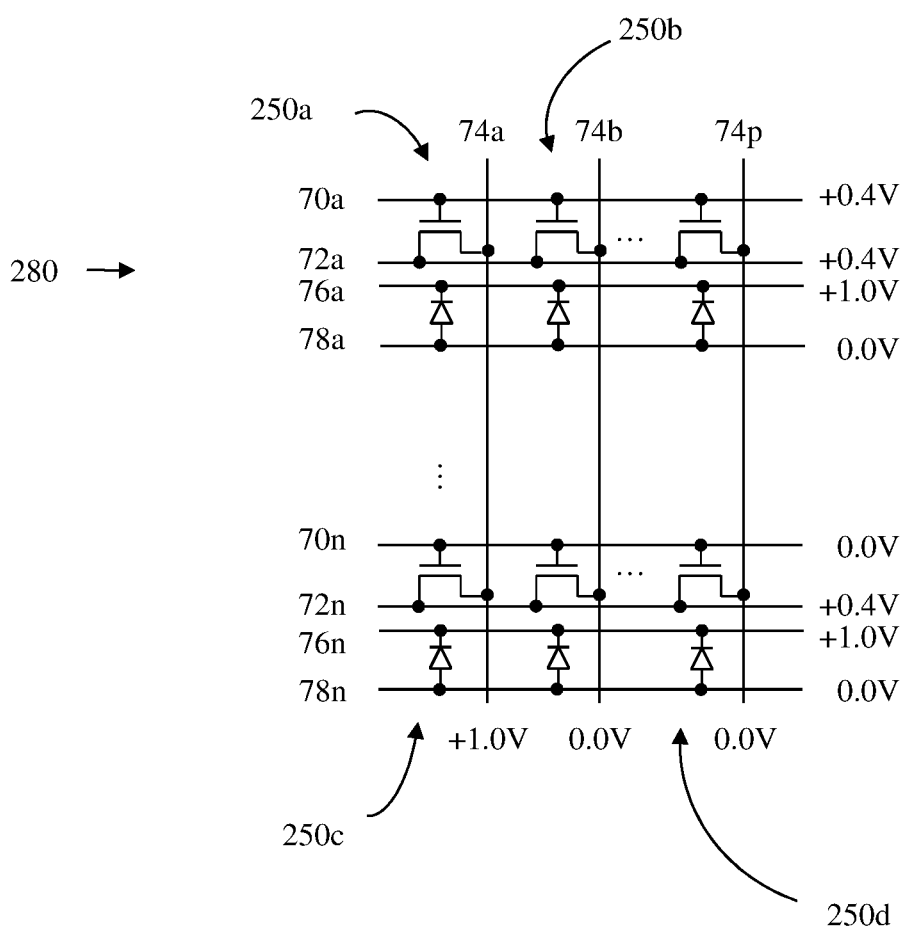
FIG. 17 schematically illustrates a read operation performed on a memory array according to an embodiment of the present invention.
Figure 18:
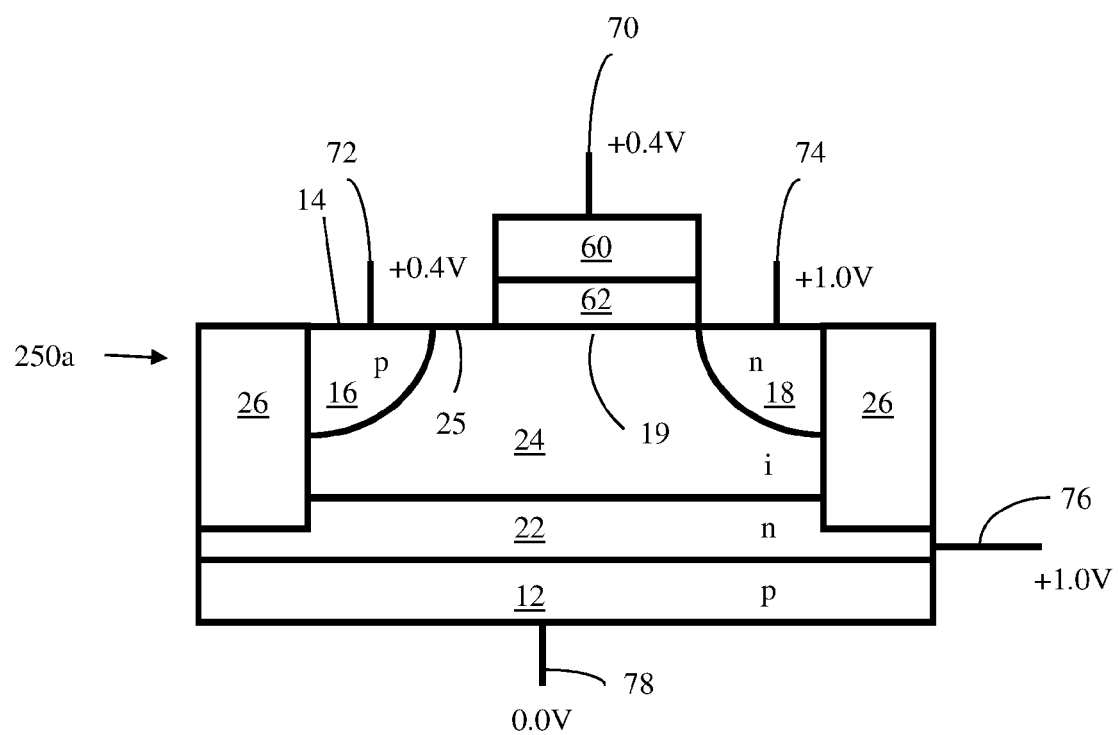
FIG. 18 illustrates bias conditions applied on the terminals of a memory cell to perform a read operation, according to an embodiment of the present invention.

FIGS. 17 and 18 illustrate the read operation performed on the memory array 280 and the bias conditions applied to the selected memory cell 250a, respectively. The read operation is performed by applying the following bias conditions: a positive voltage is applied to the selected WL terminal 70a, a positive voltage is applied to the selected BL terminal 74a, a slight positive voltage is applied to the selected SL terminal 72a, a positive voltage is applied to the selected BW terminal 76a, and zero voltage is applied to the substrate terminal 78. The following bias is applied to the unselected terminals: zero voltage is applied to the unselected WL terminals 70, zero voltage is applied to the unselected BL terminals 74, a slight positive voltage is applied to the unselected SL terminals 72, zero or positive voltage is applied to the unselected BW terminals 76, and zero voltage is applied to the unselected substrate terminals 78.

The charge stored in the floating body region 24 will modulate the threshold gate voltage to form an inversion layer in the channel region underneath the gate. The gate voltage during the read operation is selected such that inversion layer is formed when the memory cell 250 is in logic-1 state (i.e. when the floating body region 24 is positively charged) and no inversion layer is formed when the memory cell 250 is in logic-0 state (i.e. when the floating body region 24 is neutral). As Gopalakrishnan describes, memory cell 250 has a steep subthreshold slope, resulting in low leakage current from the unselected cells. As a result, the sensing operation of the state of the memory cell 250 may be performed faster.

In one particular non-limiting embodiment, about +0.4 volts is applied to the selected WL terminal 70a, about +1.0 volts is applied to the selected BL terminal 74a, about +0.4 volts is applied to the selected SL terminal 72a, about +1.0 volts is applied to the selected BW terminal 76a, and about 0.0 volts is applied to the selected substrate terminal 78a. However, these voltage levels may vary while maintaining the relative relationships between voltage levels as generally described above.

Figure 19:
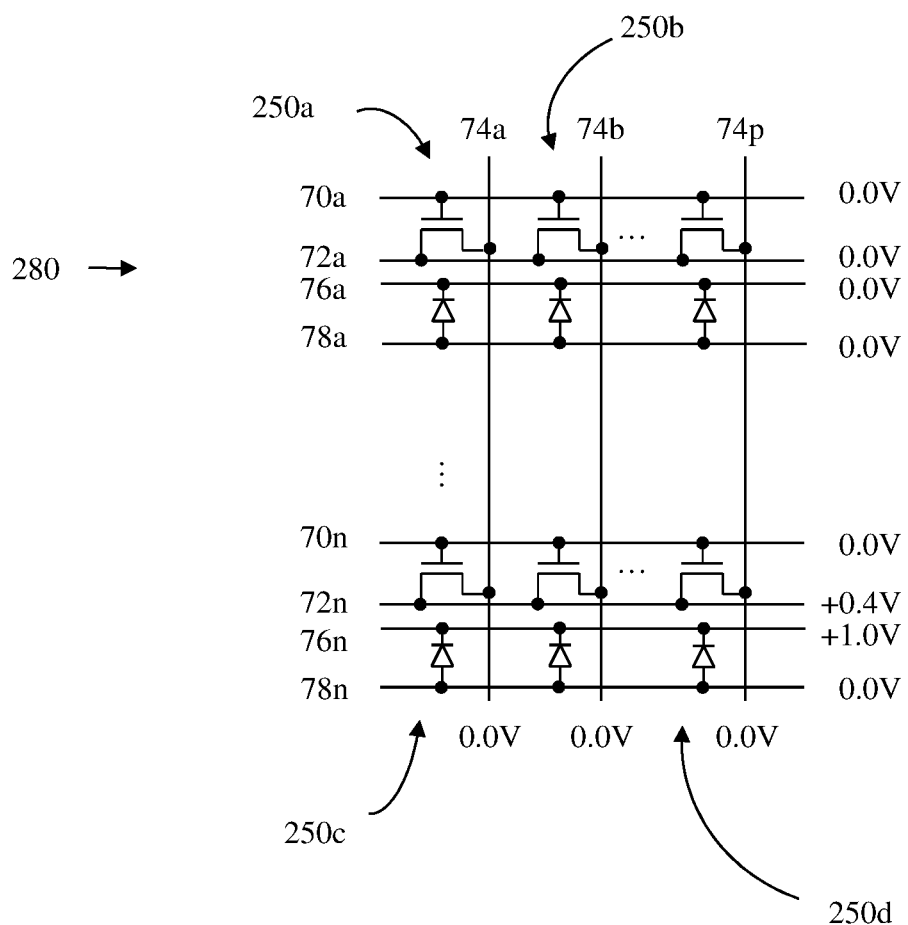
FIG. 19 schematically illustrates a write logic-0 operation performed on a memory array according to an embodiment of the present invention.
Figure 20:
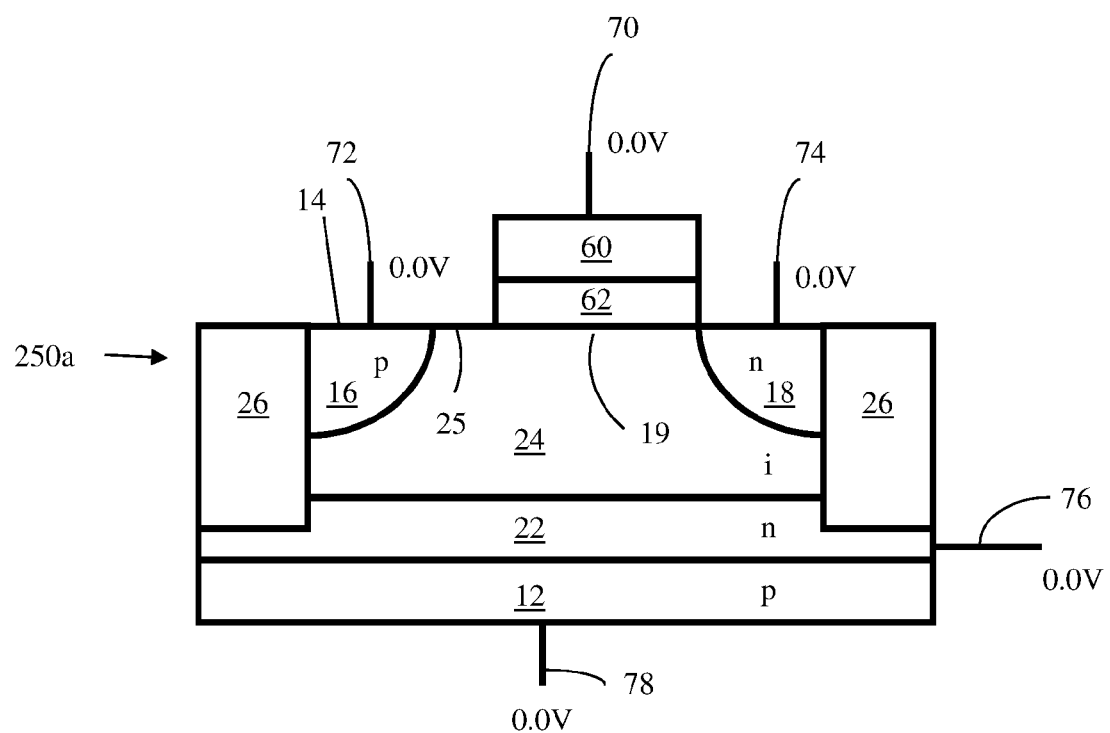
FIG. 20 illustrates bias conditions applied on the terminals of a memory cell to perform a write logic-0 operation, according to an embodiment of the present invention.

FIGS. 19 and 20 illustrate a row write logic-0 operation performed on the memory array 280 and the bias conditions applied to the terminals of the selected memory cell 250a, respectively. The following bias conditions are applied to the selected terminals to perform a row write logic-0 operation: zero voltage is applied to the selected WL terminal 70a, zero voltage is applied to the selected SL terminal 72a, zero voltage is applied to the selected BL terminal 74a, zero voltage or a positive voltage is applied to the selected BW terminal 76a, and zero voltage is applied to the selected substrate terminal 78a. The following bias conditions are applied to the unselected terminals: zero voltage is applied to the unselected WL terminals 70, a slight positive voltage is applied to the unselected SL terminals 72, zero voltage is applied to the unselected BL terminals 74, zero or positive voltage is applied to the unselected BW terminals, and zero voltage is applied to the unselected substrate terminals 78.

Removing the slight positive voltage that is applied to the selected SL terminal 72 removes the potential well that allows for positive charge storage in the floating body region 24. As a result, holes will be evacuated from the floating body region 24 and will flow to the source region 16.

In one particular non-limiting embodiment, about 0.0 volts is applied to the selected WL terminal 70a, about 0.0 volts is applied to the selected BL terminal 74a, about 0.0 volts is applied to the selected SL terminal 72a, about 0.0 volts is applied to the selected BW terminal 76a, and about 0.0 volts is applied to the selected substrate terminal 78a. However, these voltage levels may vary while maintaining the relative relationships between voltage levels as generally described above.

Figure 21:
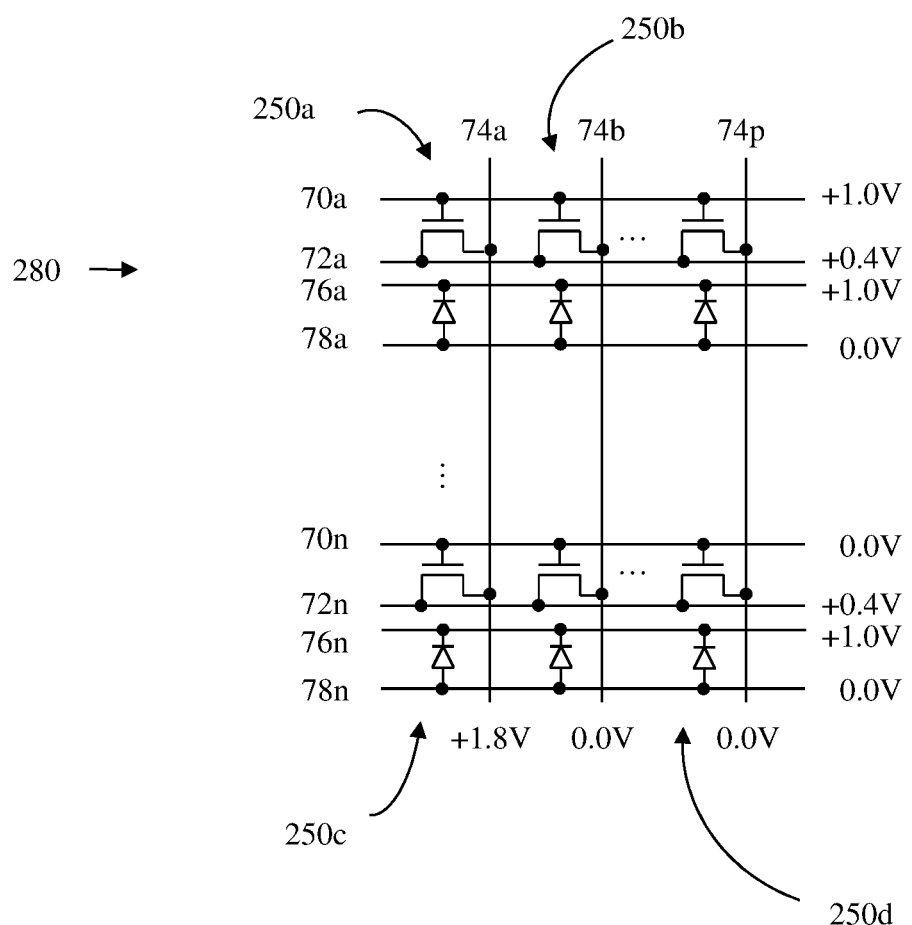
FIG. 21 schematically illustrates a write logic-1 operation performed on a memory array according to an embodiment of the present invention.
Figure 22:
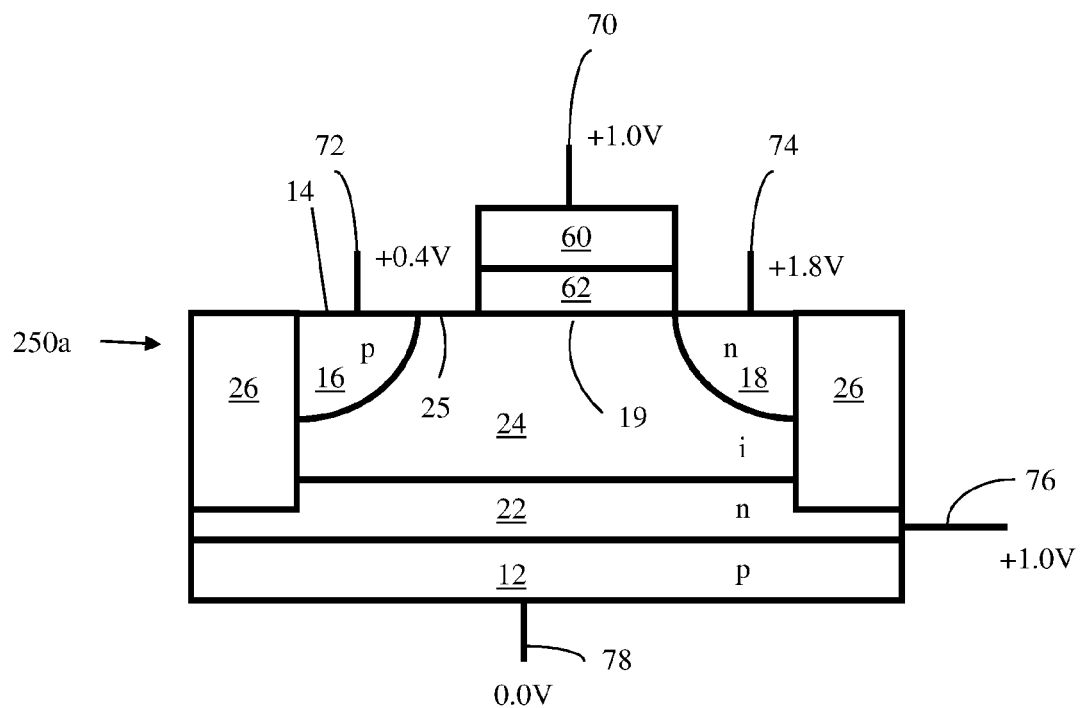
FIG. 22 illustrates bias conditions applied on the terminals of a memory cell to perform a write logic-1 operation, according to an embodiment of the present invention.

FIGS. 21 and 22 illustrate a write logic-1 operation performed on the memory array 280 and the bias conditions applied to the terminals of the selected memory cell 250a, respectively. The following bias conditions are applied to the selected terminals to perform a write logic-1 operation: a positive voltage is applied to the selected WL terminal 70a, a slight positive voltage is applied to the SL terminal 72a, a positive voltage is applied to the selected BL terminal 74a, a positive voltage is applied to the selected BW terminal 76a, and zero voltage is applied to the substrate terminal 78a. The following bias conditions are applied to the unselected terminals: zero voltage is applied to the unselected WL terminals 70, a slight positive voltage is applied to the unselected SL terminals 72, zero voltage is applied to the unselected BL terminals 74, zero or positive voltage is applied to the unselected BW terminals, and zero voltage is applied to the unselected substrate terminals 78.

The positive voltage applied to the gate 60 of the memory cell 250 has to be sufficiently high to create an inversion layer underneath the gate 60, regardless of the state of the memory cell 250. This will result in an inversion layer at the same potential level as the voltage that is applied to the bit line region 18. Hence, a strong electric field will be developed across the gap region 25, which results in hole injection into the floating body region 24 as a result of impact ionization.

In one particular non-limiting embodiment, about +1.0 volts is applied to the selected WL terminal 70a, about +1.8 volts is applied to the selected BL terminal 74a, about +0.4 volts is applied to the selected SL terminal 72a, about +1.0 volts is applied to the selected BW terminal 76a, and about 0.0 volts is applied to the selected substrate terminal 78a. However, these voltage levels may vary while maintaining the relative relationships between voltage levels as generally described above.

Figure 23:
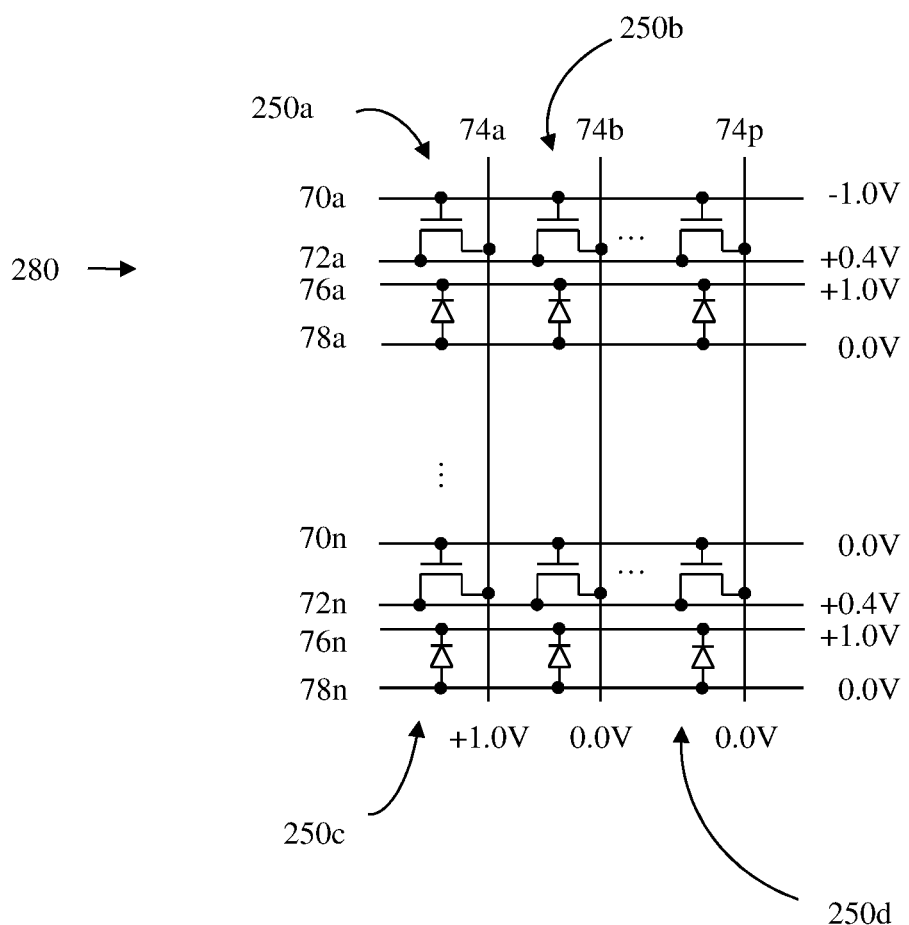
FIG. 23 schematically illustrates a write logic-1 operation using band-to-band tunneling mechanism performed on a memory array according to an embodiment of the present invention.
Figure 24:
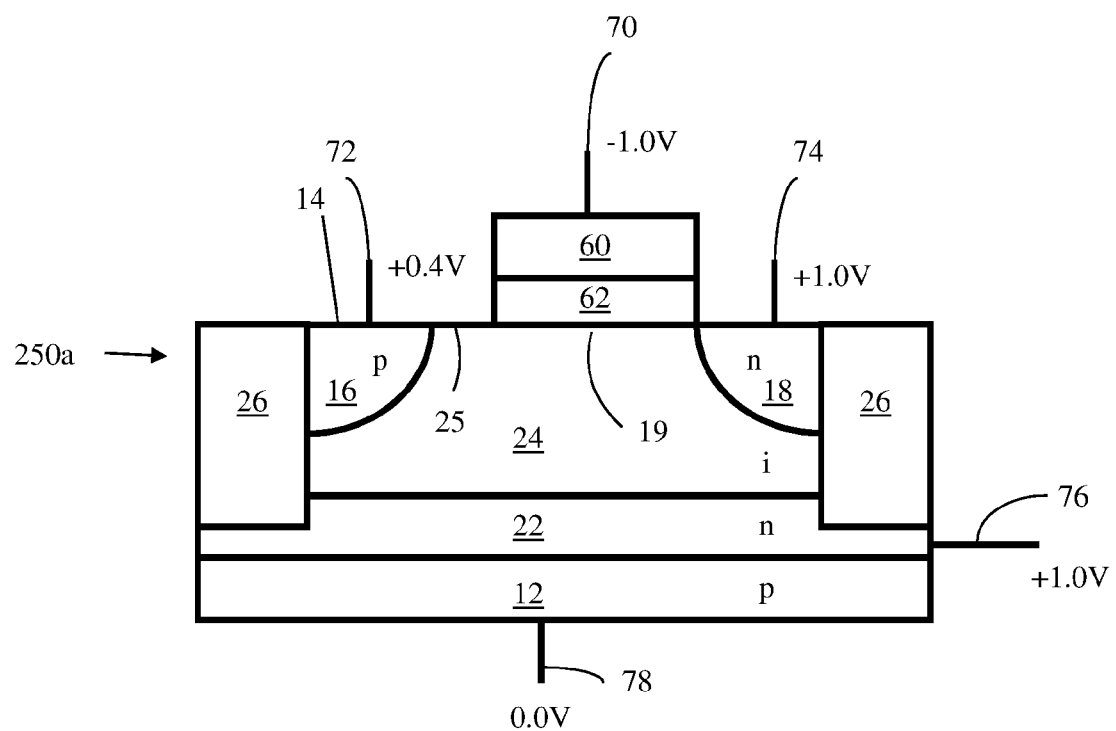
FIG. 24 illustrates bias conditions applied on the terminals of a memory cell to perform a write logic-1 operation using band-to-band tunneling mechanism, according to an embodiment of the present invention.

FIGS. 23 and 24 illustrate a write logic-1 operation using a band-to-band tunneling mechanism performed on the memory array 280 and the bias conditions applied to the terminals of the selected memory cell 250a, respectively. The following bias conditions are applied to the selected terminals to perform a write logic-1 operation: a negative voltage is applied to the selected WL terminal 70a, a slight positive voltage is applied to the SL terminal 72a, a positive voltage is applied to the selected BL terminal 74a, a positive voltage is applied to the selected BW terminal 76a, and zero voltage is applied to the substrate terminal 78a. The following bias conditions are applied to the unselected terminals: zero voltage is applied to the unselected WL terminals 70, a slight positive voltage is applied to the unselected SL terminals 72, zero voltage is applied to the unselected BL terminals 74, zero or positive voltage is applied to the unselected BW terminals, and zero voltage is applied to the unselected substrate terminals 78.

The negative voltage on the gate 60 (connected to WL terminal 70) and the positive voltage on bit line region 18 (connected to BL terminal 74) create a strong electric field (for example, about $10^6$ V/cm in silicon, as described in Sze, p. 104) between the bit line region 18 and the floating body region 24 in the proximity of gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

In one particular non-limiting embodiment, about −1.0 volts is applied to the selected WL terminal 70a, about +1.0 volts is applied to the selected BL terminal 74a, about +0.4 volts is applied to the selected SL terminal 72a, about +1.0 volts is applied to the selected BW terminal 76a, and about 0.0 volts is applied to the selected substrate terminal 78a. However, these voltage levels may vary while maintaining the relative relationships between voltage levels as generally described above.

Figure 25:
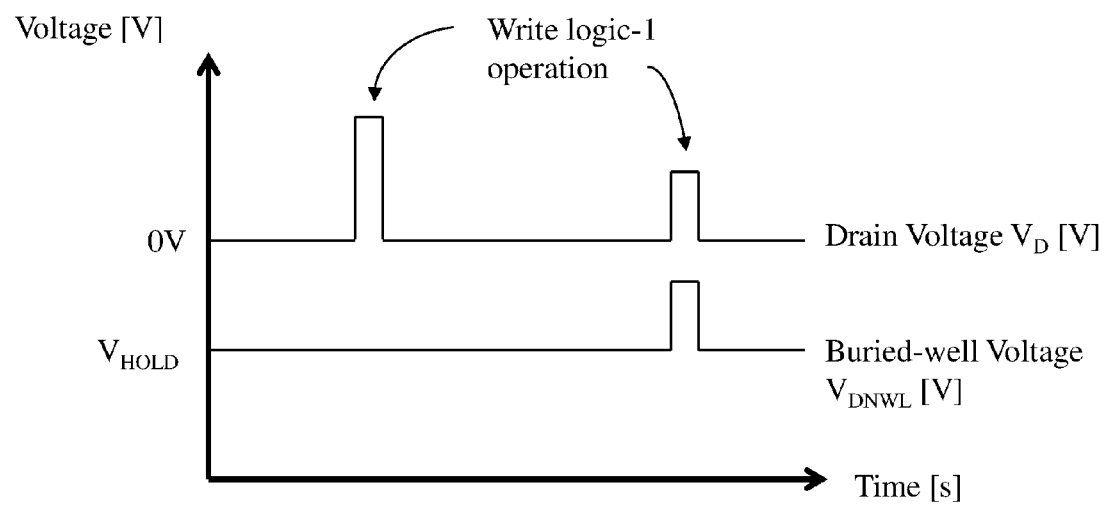
FIG. 25 illustrates voltages applied to the gate and drain regions to perform a write logic-1 operation according to another embodiment of the present invention.

FIG. 25 illustrates a method to further lower the voltage applied to the bit line region 18 during the write logic-1 operation, which can be applied to memory cells 50, 150, and 250, and to the bi-stable memory cells described for example in Widjaja-1 and Widjaja-2. FIG. 25 illustrates the voltage applied to the BL terminal 74 and the BW terminal 76. To further lower the voltage applied to the BL terminal 74, the voltage applied to the BW terminal 76 may be increased during the write logic-1 operation. Increasing the BW terminal 76 lowers the barrier for the electron flow during the write logic-1 operation, and thus increasing the holes generated under the impact ionization mechanism.

Figure 26:
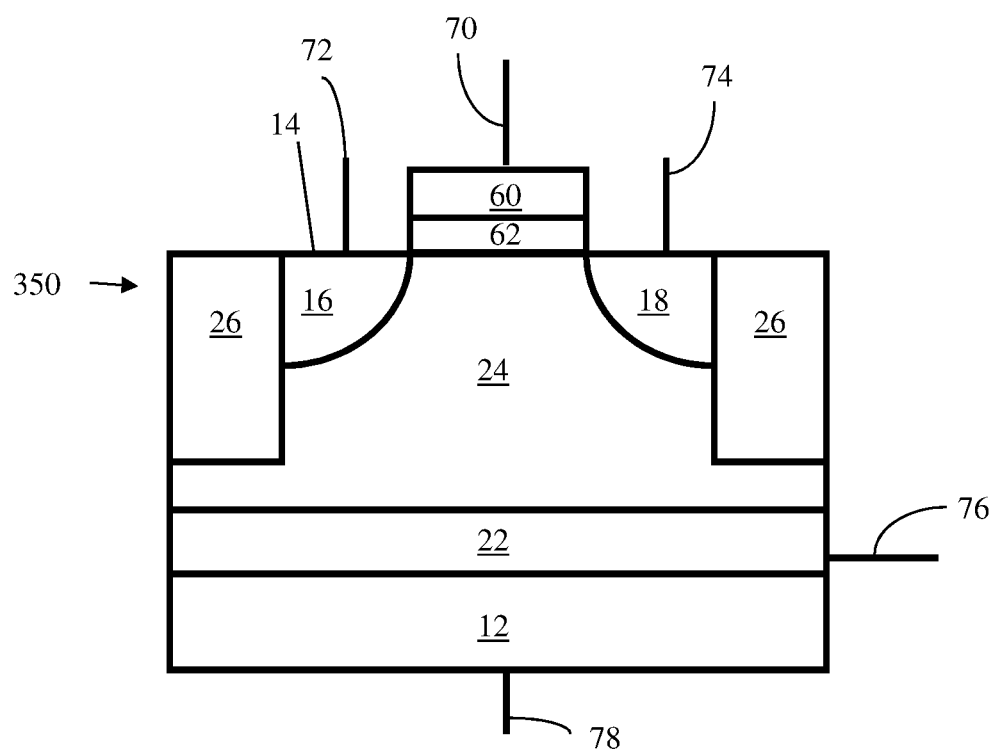
FIG. 26 is a schematic, cross-sectional illustration of a memory cell according to an embodiment of the present invention.

A schematic cross-sectional view of a memory device 350 according to another embodiment of the present invention is shown in FIG. 26. Memory cell 350 includes a substrate 12 of a first conductivity type such as p-type, for example. Substrate 12 is typically made of silicon, but may alternatively or additionally comprise, for example, germanium, silicon germanium, gallium arsenide, carbon nanotubes, and/or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example (not shown in the figures). To simplify the description, the substrate 12 will usually be drawn as the semiconductor bulk material as it is in FIG. 26.

Memory cell 350 also comprises a buried layer region 22 of a second conductivity type, such as n-type, for example; a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can also be grown epitaxially on top of substrate 12.

The floating body region 24 of the first conductivity type is bounded on top by surface 14, source line region 16, drain region 18, and insulating layer 62. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18 having a second conductivity type, such as n-type, for example, is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and/or their nitrides.

Insulating layers 26 (like, for example, shallow trench isolation (STI)), may be made of silicon oxide, for example, though other insulating materials may be used. The bottom of insulating layer 26 resides above the buried layer region 22. As can be seen in FIG. 26, there is no physical separation between adjacent memory cells 350 since the floating body region 24 of one memory cell will be connected to adjacent memory cells 350 when a plurality of memory cells 350 are connected to form a memory array 380. The isolation of floating body region 24 of adjacent memory cells 350 is accomplished electrically, through an application of a potential to the buried layer region 22, thus isolating floating body regions 24 of adjacent memory cells 350.

Cell 350 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12.

Figure 27:
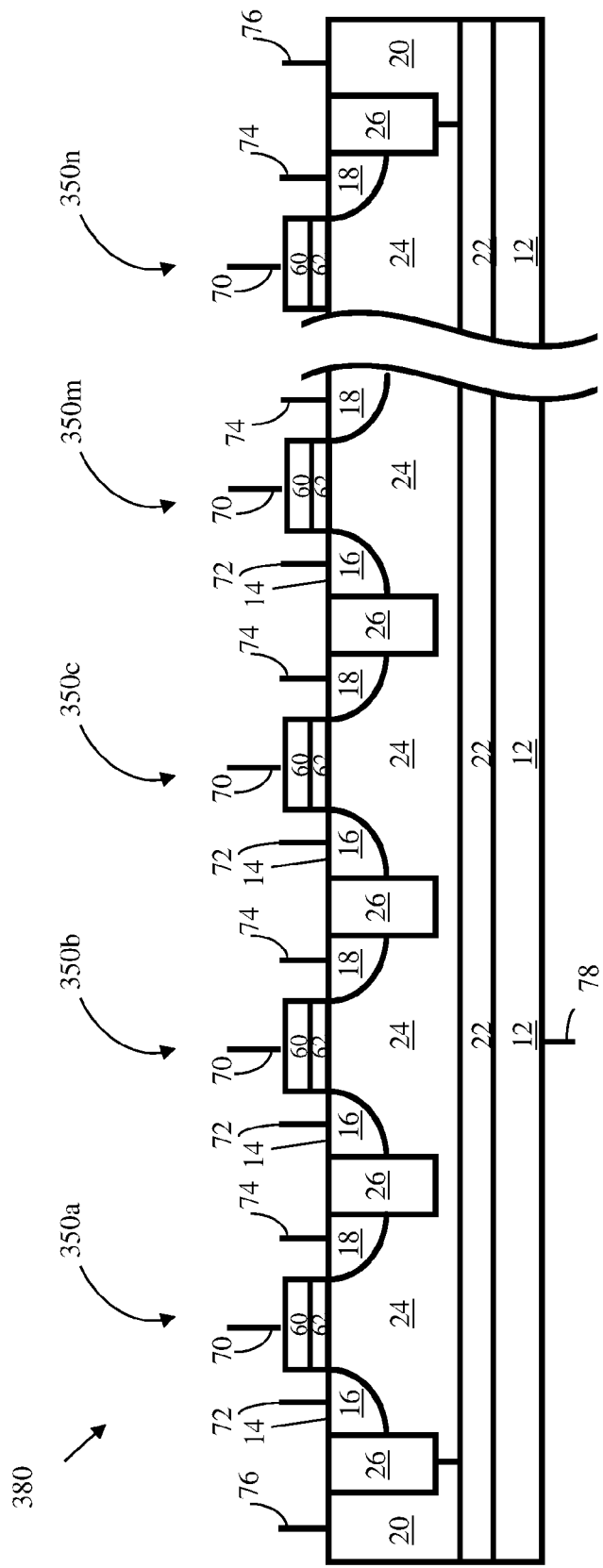
FIG. 27 is a schematic, cross-sectional illustration of a plurality of memory cells connected to form a memory array, according to an embodiment of the present invention.
Figure 28:
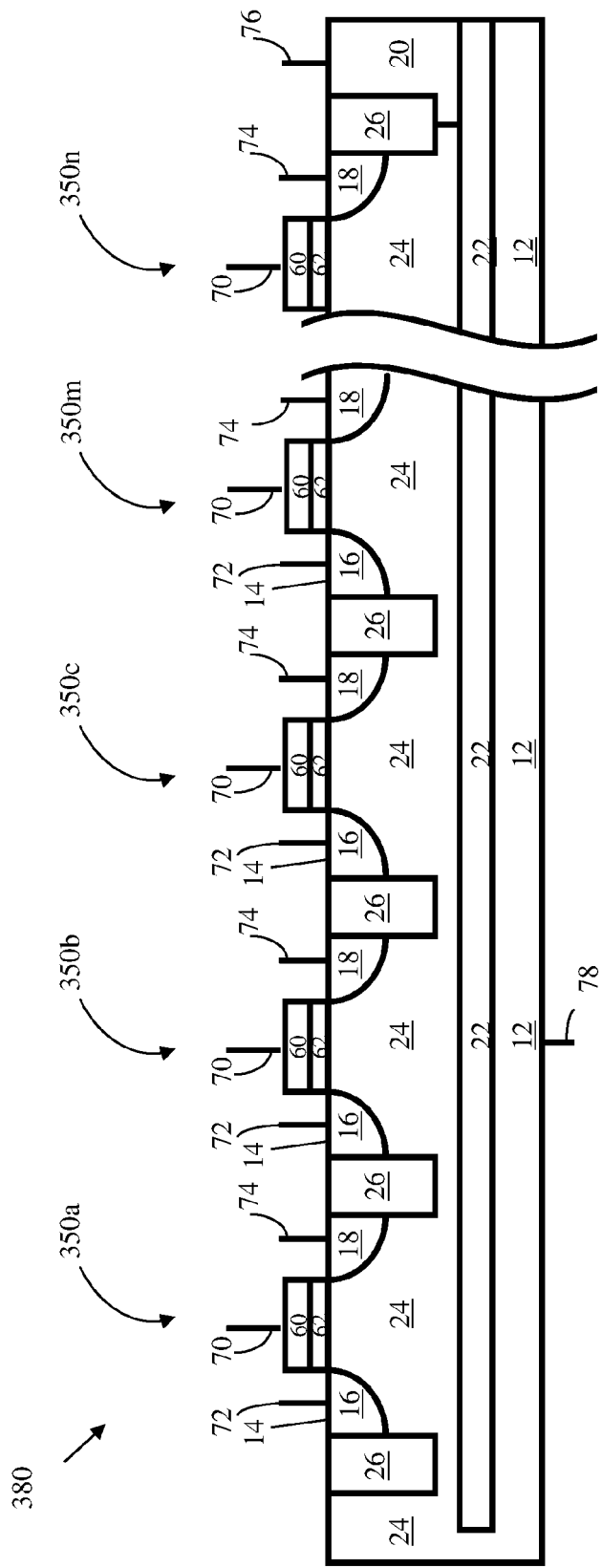
FIG. 28 is a schematic, cross-sectional illustration of a plurality of memory cells connected to form a memory array according to another embodiment of the present invention.

FIG. 27 illustrates a cross-sectional view of a plurality of memory cells 350 connected to form a memory array 380. FIG. 27 also illustrates a contact made to the buried layer region 22, which is made through regions 20 having second conductivity type. FIG. 27 illustrates a memory array 380 having region 20 on both sides of the plurality of the memory cells 350. FIG. 28 illustrates a memory array 380 according to another embodiment of the present invention, where the region 20 (which connects BW terminal 76 to the buried layer region 22), is only provided on one side of the plurality of the memory cells 350. As a result, the floating body region 24 is connected to the substrate region 12.

Figure 29:
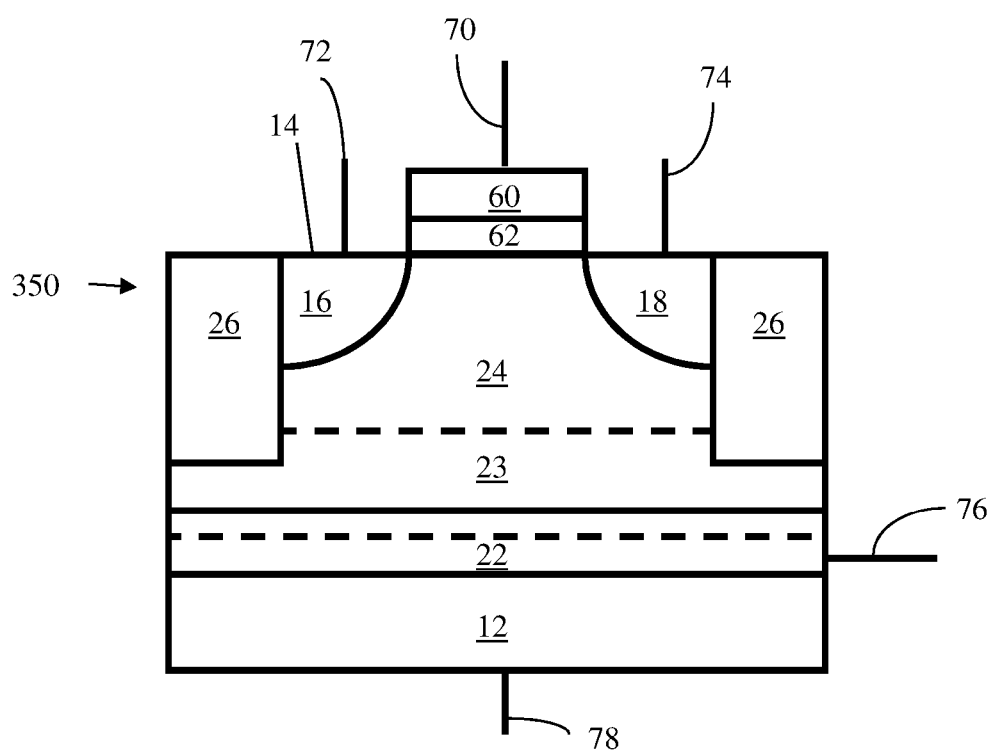
FIG. 29 schematically illustrates a depletion region that is formed as a result of a bias condition applied to the memory cell according to an embodiment of the present invention.

FIG. 29 illustrates a depletion region 23 (enclosed in dashed lines) formed in the junction of floating body region 24 and the buried layer 22 as a result of an application of a back bias to the BW terminal 76. If positive voltage is applied to the buried layer 22 while the source line region 16 or the bit line region 18 is grounded or negatively biased, depletion region 23 extends into the floating body region 24 because of reverse biased p-n junction, and the top portion of the depletion region 23 resides above the bottom of the insulating layer 26. Therefore, the floating body region 24 of one memory cell 350 is now isolated from that of adjacent memory cells 350 and forms a potential well for excess charge storage. A depletion region extends further into the region with a lower doping concentration. FIG. 29 illustrates an example where the depletion region 23 extends deeper into the floating body region 24, assuming that the doping concentration of the floating body region 24 is lighter than the doping concentration of the buried well region 22. However, this is only provided as an illustration and is not limiting.

In one embodiment, the bias conditions applied to the memory cell 350 (e.g., to establish the depletion region, as well as to establish a holding condition as described in the Widjaja references incorporated herein) are: about 0V is applied to the WL terminal 70, SL terminal 72, BL terminal 74, substrate terminal 78, and about +3.0V is applied to the BW terminal 76. These example bias conditions are provided for an n-type memory cell 350 (where the source region 16 and drain region 18 are of n-type conductivity, the floating body region 24 is of p-type conductivity, the buried layer region 22 is of n-type conductivity, and the substrate region 12 is of p-type conductivity). In other embodiments, different voltages may be applied to the various terminals of memory cell 350 and the exemplary voltages described are not limiting.

The operation of the memory cell 350 as a capacitorless DRAM has been described in Okhonin, Ohsawa, Villaret, Ranica, and Pulicani, while a holding operation to form a bi-stable memory cell, analogous to an SRAM cell, has been described in Widjaja-1 and Widjaja-2. A write logic-0 operation according to another embodiment of the present invention may be performed by removing the potential applied to the buried layer region 22. The removal of the back bias to the buried layer region 22 will in turn result in the removal of the depletion region 23, causing any charges stored in the floating region 24 to be removed, either through charge sharing to adjacent memory cells 350, or to the substrate 12. This write logic-0 operation is performed in parallel to all the cells connected to the same BW terminal 76. A parallel write logic-0 operation may also be used to accelerate the testing of the memory device. In order to write arbitrary binary data to different memory cells 350, a write logic-0 operation is first performed on all the memory cells to be written, followed by one or more write logic-1 operations on the memory cells that must be written to logic-1.

Figure 30:
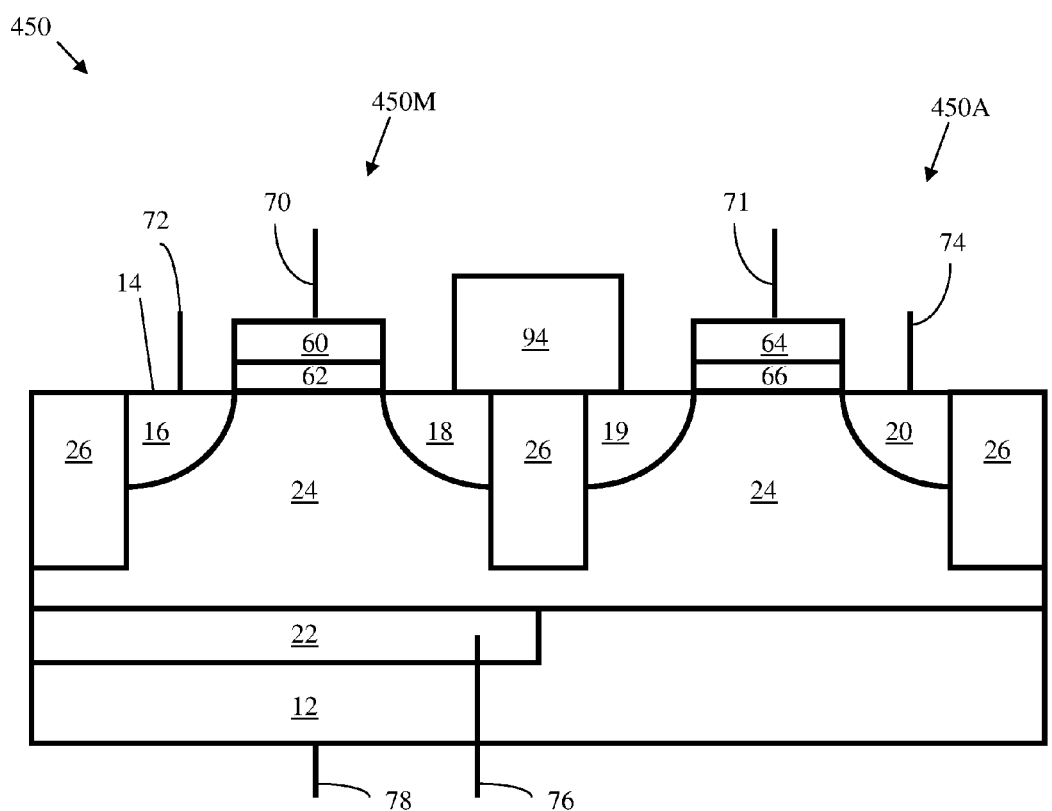
FIG. 30 is a schematic, cross-sectional illustration of a memory cell according to another embodiment of the present invention FIG. 31 schematically illustrates a depletion region that is formed as a result of a bias condition applied to the memory cell illustrated in FIG. 31.

FIG. 30 illustrates memory cell 450 according to another embodiment of the present invention. Memory cell 450 consists of a memory device 450M and access device 450A, that are connected in series, as described for example in PCT/US13/26466 to Widjaja et al., titled "Memory Cell Comprising First and Second Transistors and Methods of Operating", which is hereby incorporated herein, in its entirety, by reference thereto.

Memory cell 450 comprises a memory device 450M having a buried layer region 22, located below the insulating region 26, similar to the memory cell 350 illustrated in FIG. 26. Access transistor 450A consists of a well region 24 (which is physically connected to the floating body region 24 of the memory device 450M, but will be electrically separated through an application of a potential to the buried well region 22), source region 19 and drain region 20, and gate region 64 which is isolated from the well region 24 by an insulating layer 66. Insulating layer 66 may be made of silicon oxide and/or other dielectric materials, including high-K dielectric materials, such as, but not limited to, tantalum peroxide, titanium oxide, zirconium oxide, hafnium oxide, and/or aluminum oxide. The gate 64 may be made of, for example, polysilicon material or metal gate electrode, such as tungsten, tantalum, titanium and their nitrides.

The drain region 18 of the memory device 450M is connected to the source region 19 of the access device 450A through a conductive element 94. The conductive element 94 may be formed of, but not limited to, tungsten or silicided silicon.

In addition to the SL terminal 72 and BL terminal 74, memory cell 450 also includes word line 1 (WL1) terminal 70, which is electrically connected to the gate 60 of the memory device 450M, word line 2 (WL2) terminal 71, which is electrically connected to the gate 64 of the access transistor 450A, buried well (BW) terminal 76, which is electrically connected to the buried well region 22 of the memory device 450M, and substrate (SUB) terminal 78, which is connected to the substrate region 12.

Figure 31:
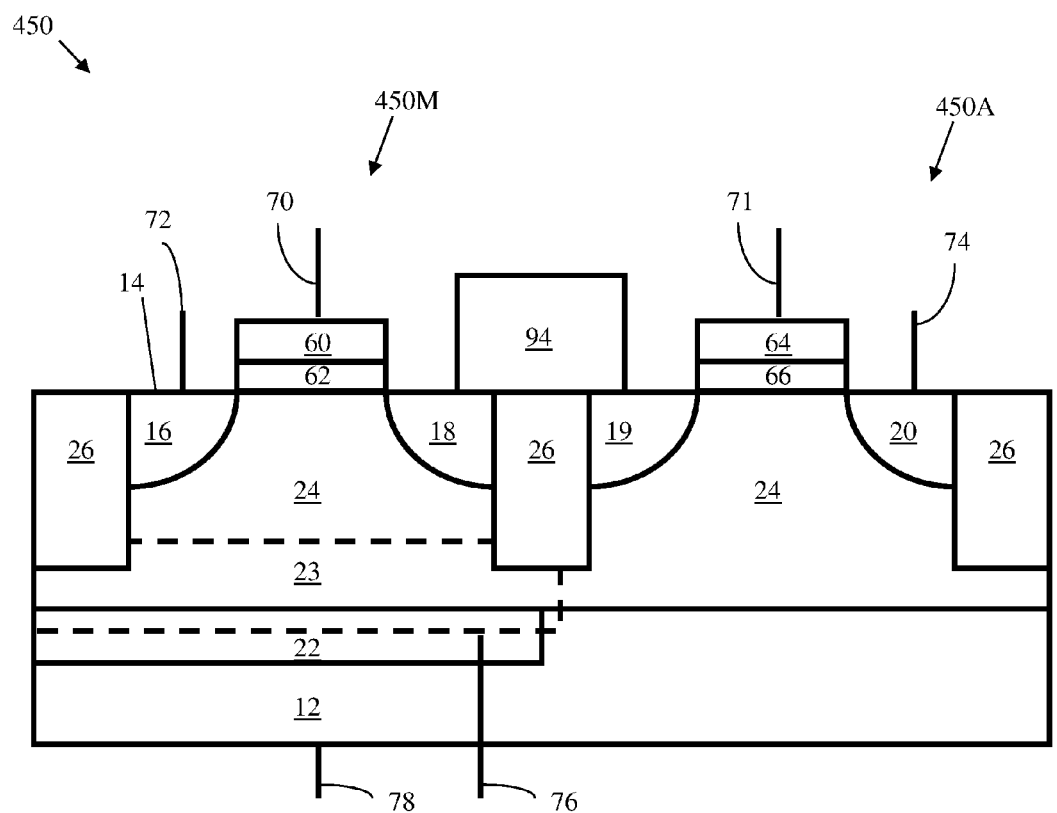

As illustrated in FIG. 31, application of a potential to the buried well region 22 of the memory device 450M will electrically isolate the floating body region 24 from the substrate region 12 as well as from adjacent floating body region 24 of adjacent memory cells 450. In one embodiment, the bias conditions applied to the memory cell 450 (e.g., to electrically isolate the floating body region as well as to establish the holding condition, as described in the Widjaja references incorporated herein) are: about 0V is applied to the WL1 terminal 70, WL2 terminal 71, SL terminal 72, BL terminal 74, substrate terminal 78, and about +3.0V is applied to the BW terminal 76. These example bias conditions are provided for an n-type memory device 450M (where the source region 16 and drain region 18 are of n-type conductivity, the floating body region 24 is of p-type conductivity, the buried layer region 22 is of n-type conductivity, and the substrate region 12 is of p-type conductivity). In other embodiments, different voltages may be applied to the various terminals of memory cell 450 and the exemplary voltages described are not limiting.

A write logic-0 operation according to another embodiment of the present invention may be performed by removing the potential applied to the buried layer region 22. The removal of the back bias to the buried layer region 22 will in turn result in the removal of the depletion region 23, causing any charges stored in the floating region 24 to be removed, either through charge sharing to adjacent memory cells 450, or to the substrate 12. This write logic-0 operation is performed in parallel to all the cells connected to the same BW terminal 76. A parallel write logic-0 operation may also be used to accelerate the testing of the memory device. In order to write arbitrary binary data to different memory cells 450, a write logic-0 operation is first performed on all the memory cells to be written, followed by one or more write logic-1 operations on the memory cells that must be written to logic-1.

Figure 32:
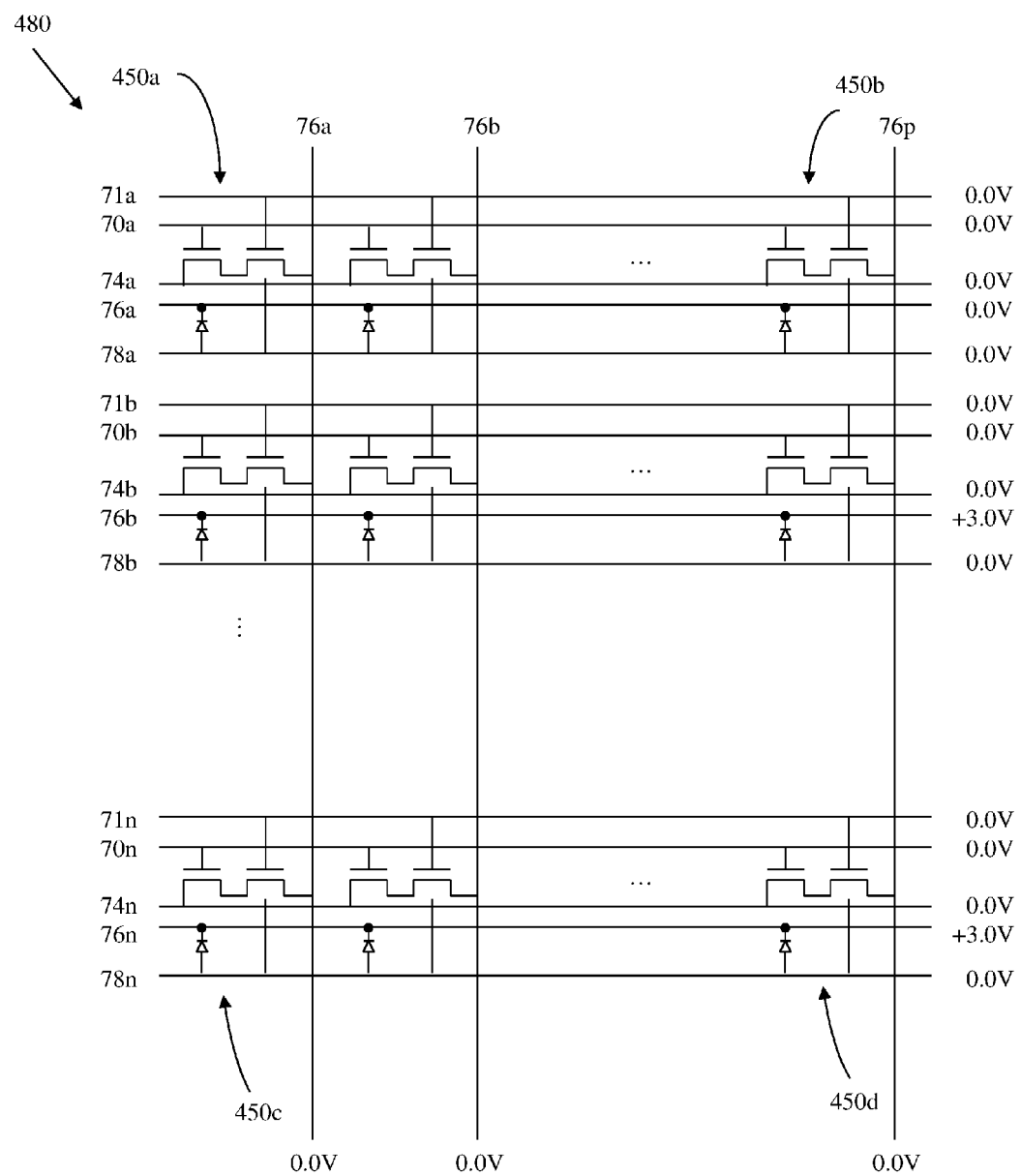
FIG. 32 illustrates a bias condition applied to the memory cell during a write logic-0 operation according to an embodiment of the present invention.

FIG. 32 illustrates the bias conditions for the write logic-0 operation performed on a memory array 480 comprising a plurality of memory cells 450 arranged in rows and columns.

That which is claimed is:

1. A semiconductor memory device comprising:
a memory cell comprising:
a floating body region configured to be charged to a level indicative of a state of the memory cell selected from at least first and second states;
a first region in electrical contact with said floating body region;
a second region in electrical contact with said floating body region and spaced apart from said first region;
a gate positioned between said first and second regions;
a first insulating region located above said floating body region;
second insulating regions adjacent to said floating body region;
a buried layer region located below said floating body region and said second insulating regions and spaced from said second insulating regions so as not to contact said second insulating regions; and
a third region in electrical contact with said buried layer region; and
a substrate region different from said third region and underlying said buried layer region;
wherein said floating body region is bounded by said first insulating region above said floating body region, said second insulating regions adjacent to said floating body region, and a depletion region formed as a result of an application of a back bias to said buried layer region.

2. The semiconductor memory device of claim 1, wherein said buried layer region is positioned between said substrate region and said floating body region.

3. The semiconductor memory device of claim 1, wherein said first region has a first conductivity type selected from a p-type conductivity type and an n-type conductivity type;
said second region has said first conductivity type;
said floating body region has a second conductivity type selected from said p-type conductivity type and said n-type conductivity type and different from said first conductivity type;
said buried layer region has said first conductivity type; and
said third region has said first conductivity type.

4. The semiconductor memory device of claim 1, wherein said back bias is applied as a constant positive voltage bias.

5. The semiconductor memory device of claim 1, wherein said buried layer region is configured to inject charge into or extract charge out of said floating body region to maintain said state of the memory cell.

6. A semiconductor memory array comprising at least two memory cells, wherein each said memory cell comprises:
a floating body region configured to be charged to a level indicative of a state of the memory cell selected from at least first and second states;
a first region in electrical contact with said floating body region;
a second region in electrical contact with said floating body region and spaced apart from said first region;
a gate positioned between said first and second regions;
a first insulating region located above said floating body region;
second insulating regions adjacent to said floating body region;
a buried layer region located below said floating body region and said second insulating regions;
a third region in electrical contact with said buried layer region; and
a substrate region different from said third region and underlying said buried layer region;
wherein at least one of said floating body regions is integral with or connected to another of said floating body regions; and
wherein said array further comprises a third region in electrical contact with said buried layer region.

7. The semiconductor memory array of claim 6, wherein each said memory cell further comprises a substrate region, wherein said buried layer region is positioned between said substrate region and said floating body region.

8. The semiconductor memory array of claim 6, wherein said first region has a first conductivity type selected from a p-type conductivity type and an n-type conductivity type;
said second region has said first conductivity type;

said floating body region has a second conductivity type selected from said p-type conductivity type and said n-type conductivity type and different from said first conductivity type;

said buried layer region has said first conductivity type; and said third region has said first conductivity type.

9. The semiconductor memory array of claim 6, wherein said buried layer region is configured to inject charge into or extract charge out of said floating body region to maintain said state of the memory cell.

10. A semiconductor memory array comprising at least two memory cells, wherein each said memory cell comprises:

a floating body region configured to be charged to a level indicative of a state of the memory cell selected from at least first and second states;

a first region in electrical contact with said floating body region;

a second region in electrical contact with said floating body region and spaced apart from said first region;

a gate positioned between said first and second regions;

a first insulating region located above said floating body region;

second insulating regions adjacent to said floating body region; and a buried layer region located below said floating body region and said second insulating regions, wherein at least one of said floating body regions is integral with or connected to another of said floating body regions;

wherein a depletion region formed as a result of an application of a back bias to said buried layer region and at least one of said second insulating regions adjacent to said floating body region insulates said memory cell from an adjacent memory cell, wherein application of said back bias results in at least two stable floating body charge levels; and wherein said array further comprises a third region in electrical contact with said buried layer region, said third region having a conductivity type the same as a conductivity type of said buried layer.

11. The semiconductor memory array of claim 10, wherein each said memory cell further comprises a substrate region, wherein said buried layer region is positioned between said substrate region and said floating body region.

12. The semiconductor memory array of claim 10, wherein said first region has a first conductivity type selected from a p-type conductivity type and an n-type conductivity type;

said second region has said first conductivity type;

said floating body region has a second conductivity type selected from said p-type conductivity type and said n-type conductivity type and different from said first conductivity type;

said buried layer region has said first conductivity type; and said third region has said first conductivity type.

13. The semiconductor memory cell of claim 10, wherein said back bias is applied as a constant positive voltage bias.

14. The semiconductor memory cell of claim 10, wherein said buried layer region is configured to inject charge into or extract charge out of said floating body region to maintain said state of the memory cell.

* * * * *